(12) United States Patent
Lee et al.

(10) Patent No.: US 9,793,249 B2
(45) Date of Patent: Oct. 17, 2017

(54) LIGHT EMITTING DEVICE AND LIGHT UNIT HAVING THE SAME

(71) Applicant: LG INNOTEK CO., LTD., Seoul (KR)

(72) Inventors: Tae Sung Lee, Seoul (KR); Young Min Ryu, Seoul (KR); Jae Hwan Jung, Seoul (KR); Jong Beom Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 42 days.

(21) Appl. No.: 15/064,946

(22) Filed: Mar. 9, 2016

(65) Prior Publication Data

US 2016/0268237 A1 Sep. 15, 2016

(30) Foreign Application Priority Data

Mar. 11, 2015 (KR) .................. 10-2015-0033790

(51) Int. Cl.
| | |
|---|---|
| *H01L 33/48* | (2010.01) |
| *H01L 33/50* | (2010.01) |
| *H01L 33/60* | (2010.01) |
| *H01L 33/62* | (2010.01) |
| *H01L 25/075* | (2006.01) |
| *H01L 25/16* | (2006.01) |
| *H01L 33/64* | (2010.01) |

(52) U.S. Cl.
CPC ........ *H01L 25/0753* (2013.01); *H01L 25/167* (2013.01); *H01L 33/486* (2013.01); *H01L 33/505* (2013.01); *H01L 33/60* (2013.01); *H01L 33/62* (2013.01); *H01L 33/647* (2013.01); *H01L 2224/48091* (2013.01); *H01L 2224/48247* (2013.01)

(58) Field of Classification Search
CPC ..... H01L 33/486; H01L 33/60; H01L 33/505; H01L 33/62; H01L 33/647
See application file for complete search history.

(56) References Cited

U.S. PATENT DOCUMENTS

| | | |
|---|---|---|
| 2008/0041625 A1 | 2/2008 | Cheong et al. |
| 2012/0262941 A1 | 10/2012 | Min |
| 2013/0043494 A1 | 2/2013 | Han et al. |

FOREIGN PATENT DOCUMENTS

| | | |
|---|---|---|
| EP | 2 782 150 | 9/2014 |
| KR | 10-0665216 B1 | 1/2007 |
| KR | 10-2007-0016240 A | 2/2007 |
| KR | 10-0965120 B1 | 6/2010 |
| KR | 10-2010-0135496 A | 12/2010 |
| KR | 10-2014-0069488 A | 6/2014 |

OTHER PUBLICATIONS

European Search Report dated Jun. 23, 2016 issued in Application No. 16158879.3.

*Primary Examiner* — Seahvosh Nikmanesh
(74) *Attorney, Agent, or Firm* — KED & Associates, LLP

(57) ABSTRACT

A light emitting device is provided. The light emitting device may include a body, first and second lead frames coupled to the body, a first light emitting chip on the first lead frame, a second light emitting chip on the second lead frame, and a reflective frame on the body and the first and second lead frames. The reflective frame may include a first opening provided therein with the first light emitting chip and a second opening provided therein with the second light emitting chip.

20 Claims, 14 Drawing Sheets

LIGHT EMITTING DEVICE AND LIGHT UNIT HAVING THE SAME

CROSS-REFERENCE TO RELATED APPLICATION

The present application claims priority under 35 U.S.C. §119(a) to Korean Patent Application No. 10-2015-0033790, filed on Mar. 11, 2015, whose entire disclosure is incorporated herein by reference.

BACKGROUND

Field

Embodiments relate to a light emitting device, a light emitting device having a plurality of light emitting chips, and a light unit having a light emitting device.

Background

Light Emitting Diodes (LEDs) are semiconductor devices that convert electrical energy into light and are extensively used as next-generation light sources in place of other light sources, such as, e.g., fluorescent lamps and glow lamps. Since an LED generates light using a semiconductor device, the LED may have lower power consumption compared to a glow lamp that generates light by heating tungsten or a fluorescent lamp that generates light by urging ultraviolet rays, which are generated through a high-voltage discharge, to collide with a fluorescent substance. In addition, as the LED generates light using the potential gap of the semiconductor device, the LED may have a long life span, a rapid response characteristic, and an environmental-friendly characteristic compared to other light sources.

Various studies and research have been performed to substitute other light sources with the LED. LEDs are increasingly used as light sources for lighting devices, such as, e.g., various lamps used indoors and outdoors, liquid crystal displays, electric signboards, and street lamps.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
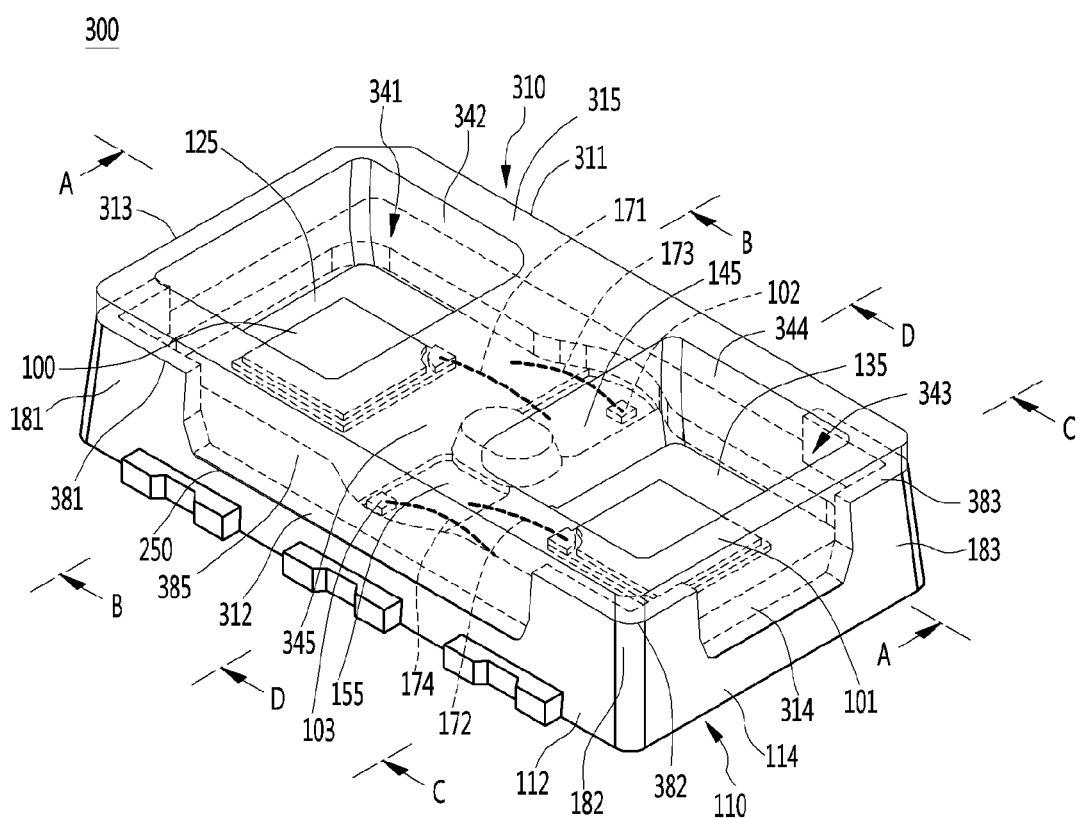
FIG. 1 is a perspective view showing a light emitting device according to an embodiment.
Figure 2:
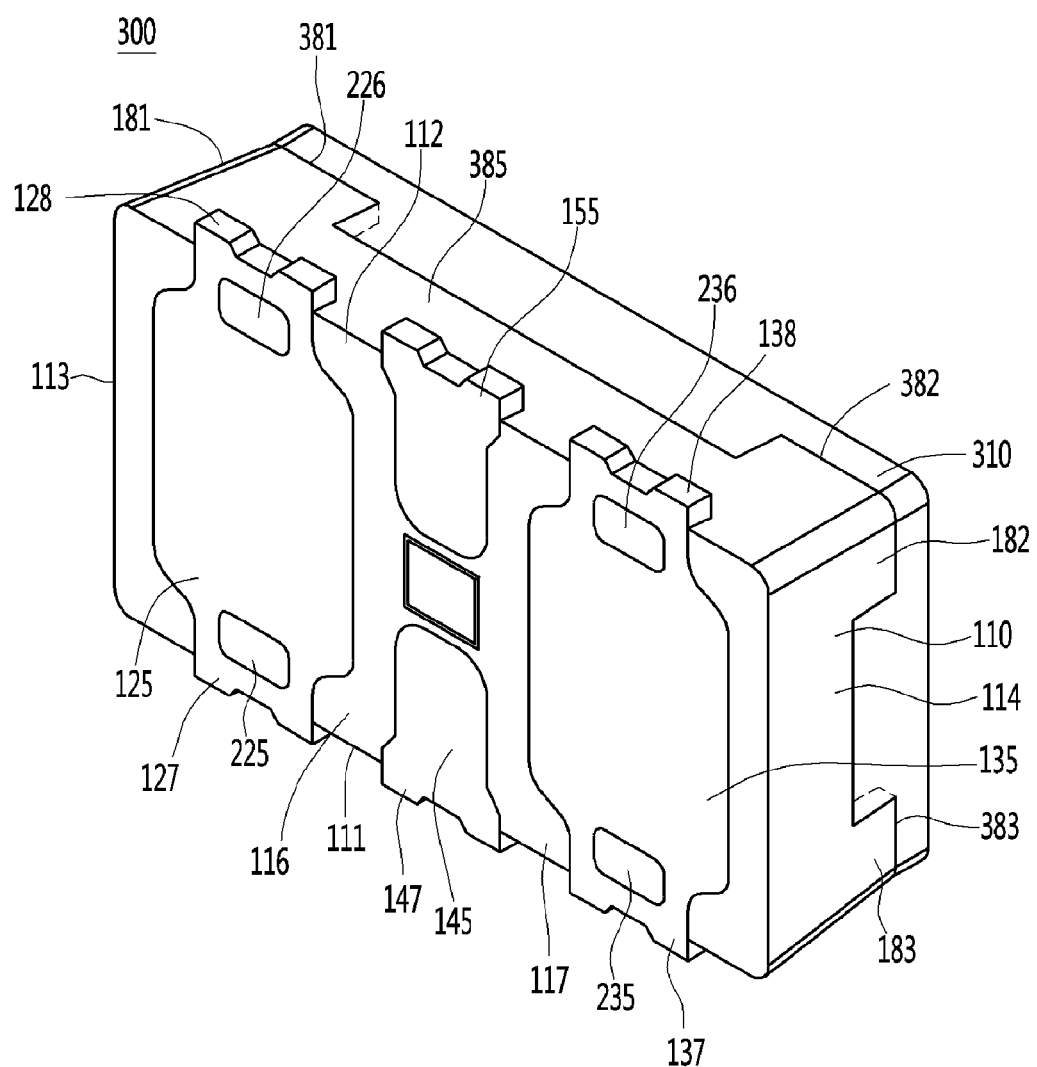
FIG. 2 is a perspective view showing a bottom surface of the light emitting device of FIG. 1.
Figure 2:
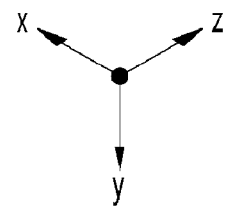
Figure 3:
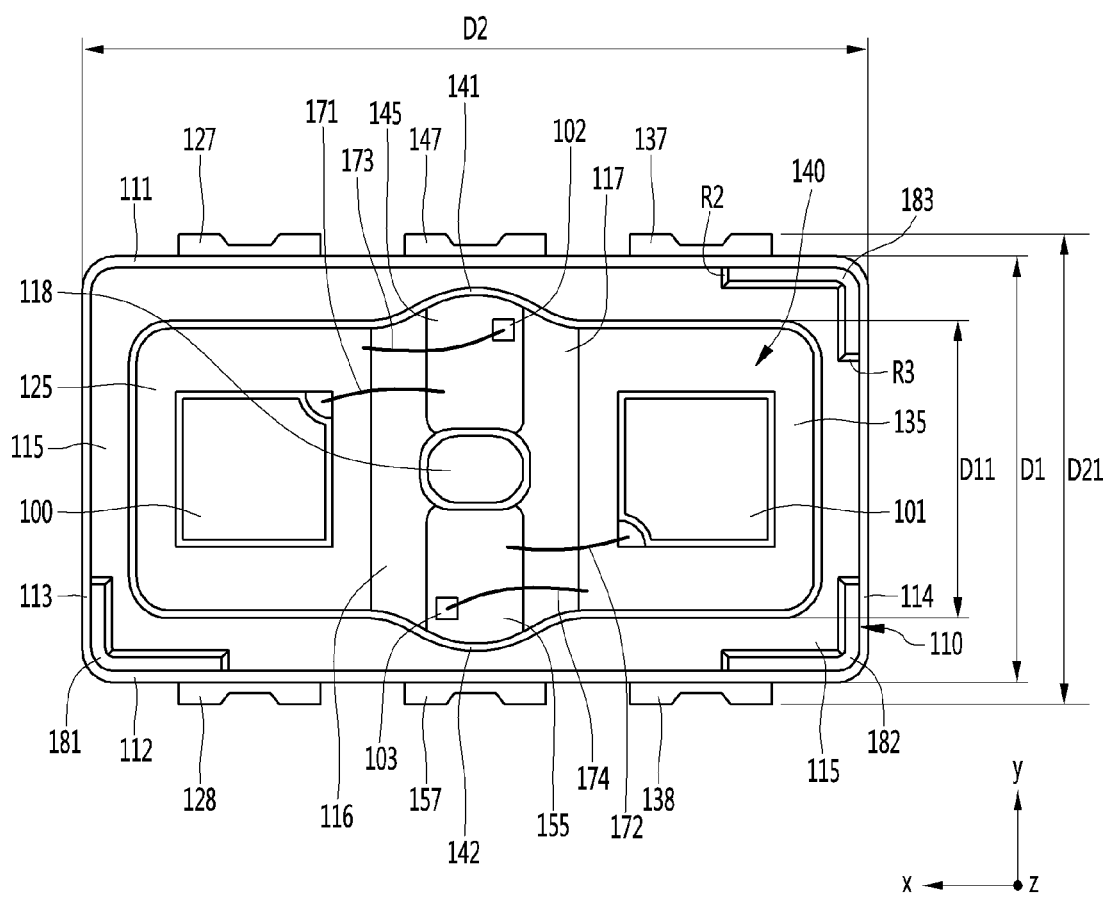
FIG. 3 is a view showing the light emitting device having no reflective frame of FIG. 2.
Figure 4:
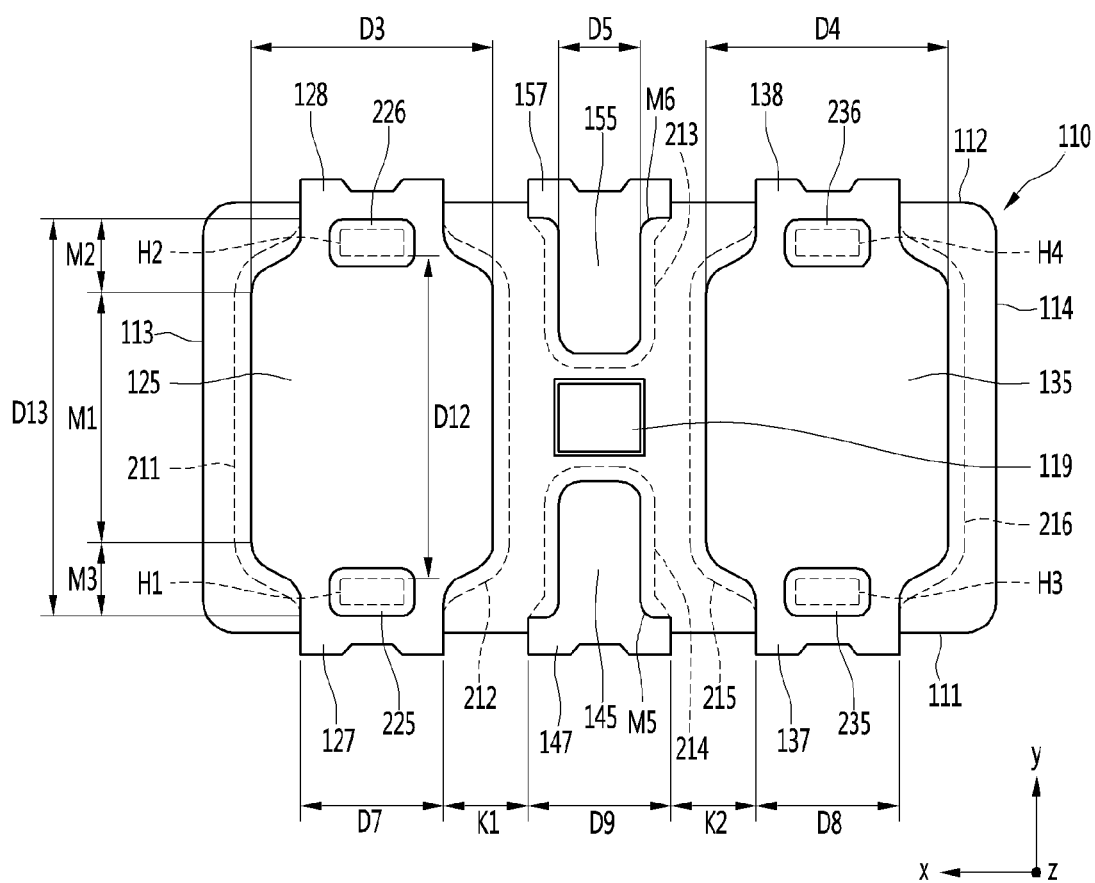
FIG. 4 is a bottom view showing the light emitting device of FIG. 3.
Figure 5:
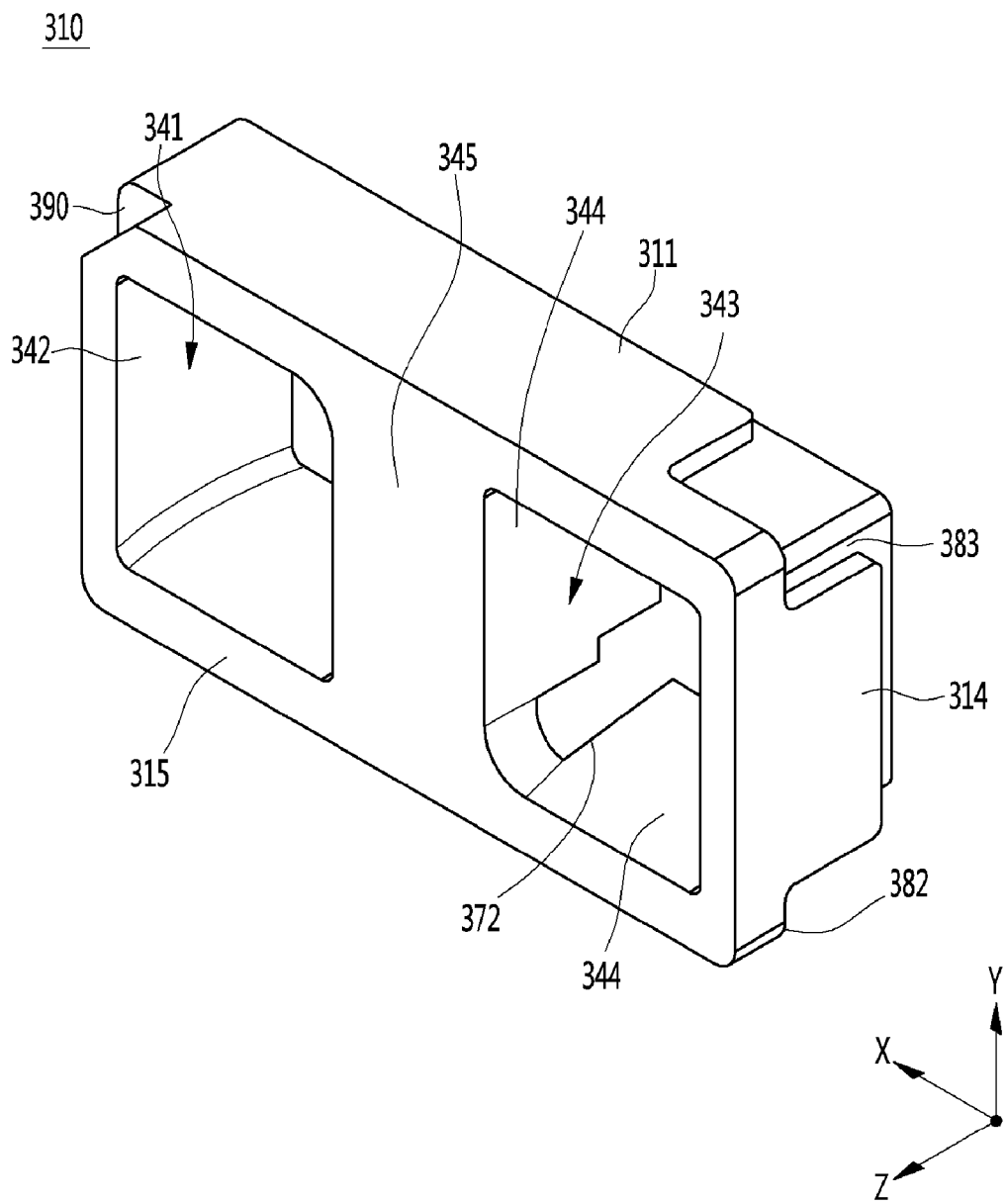
FIG. 5 is a perspective view showing the reflective frame of FIG. 2.
Figure 6:
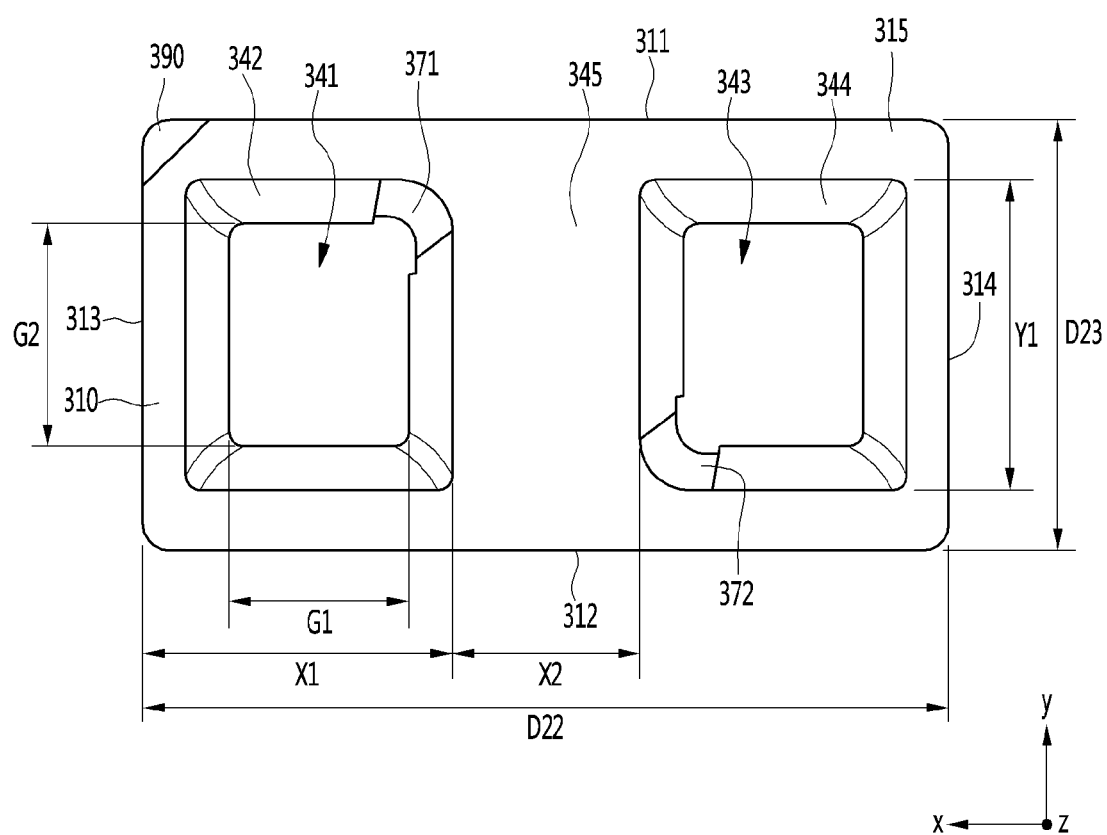
FIG. 6 is a plan view showing the reflective frame of FIG. 5.
Figure 7:
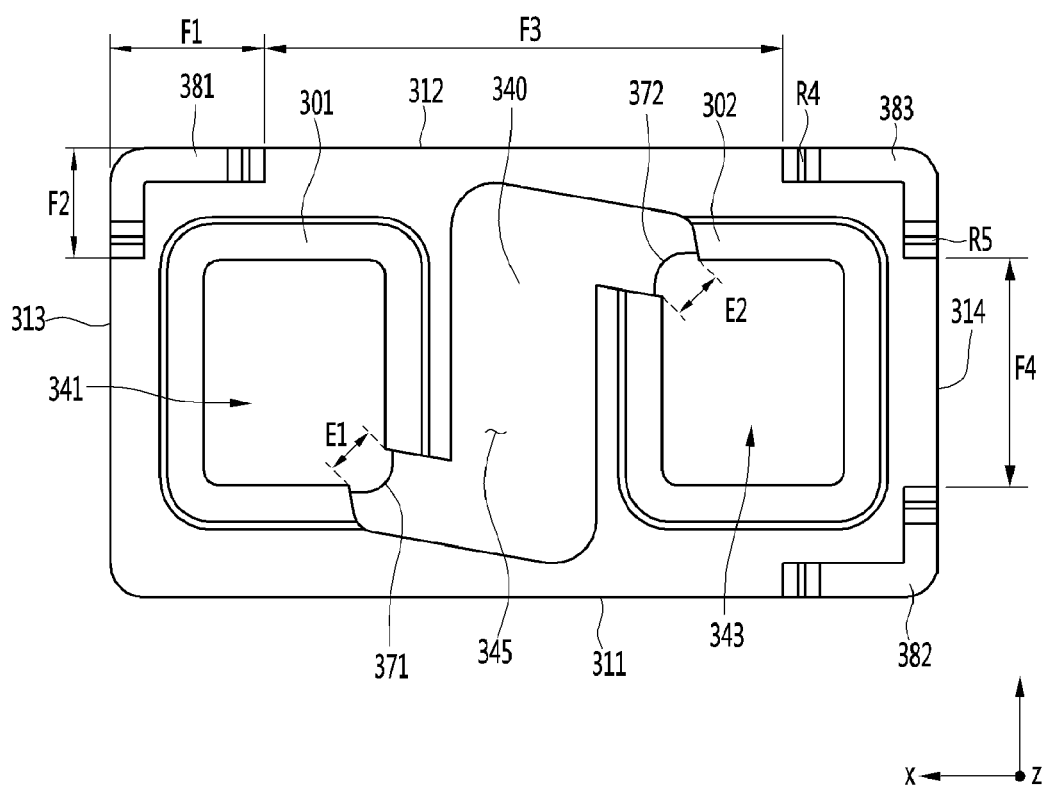
FIG. 7 is a bottom view showing the reflective frame of FIG. 6.
Figure 8:
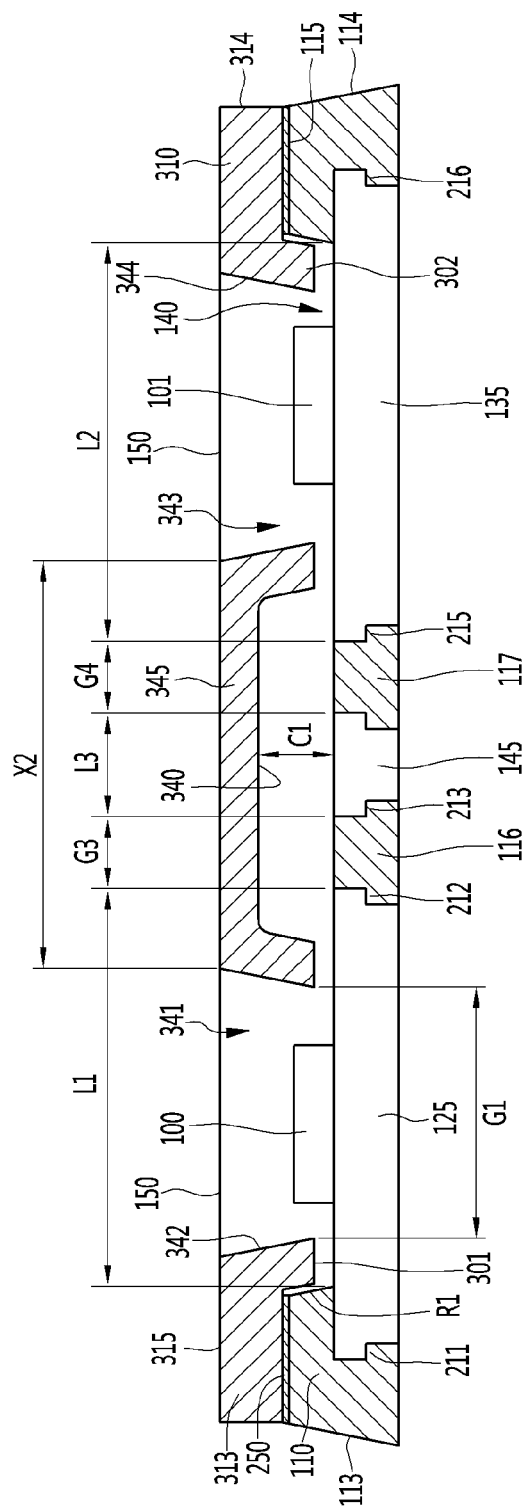
FIG. 8 is a sectional view taken along line A-A of the light emitting device of FIG. 1.
Figure 9:
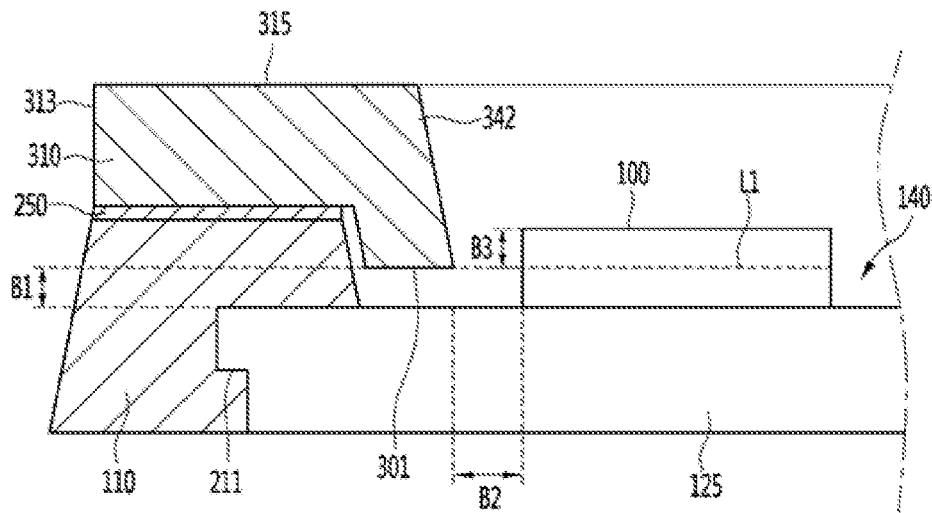
FIG. 9 is a partial enlarged view of FIG. 8.
Figure 10:
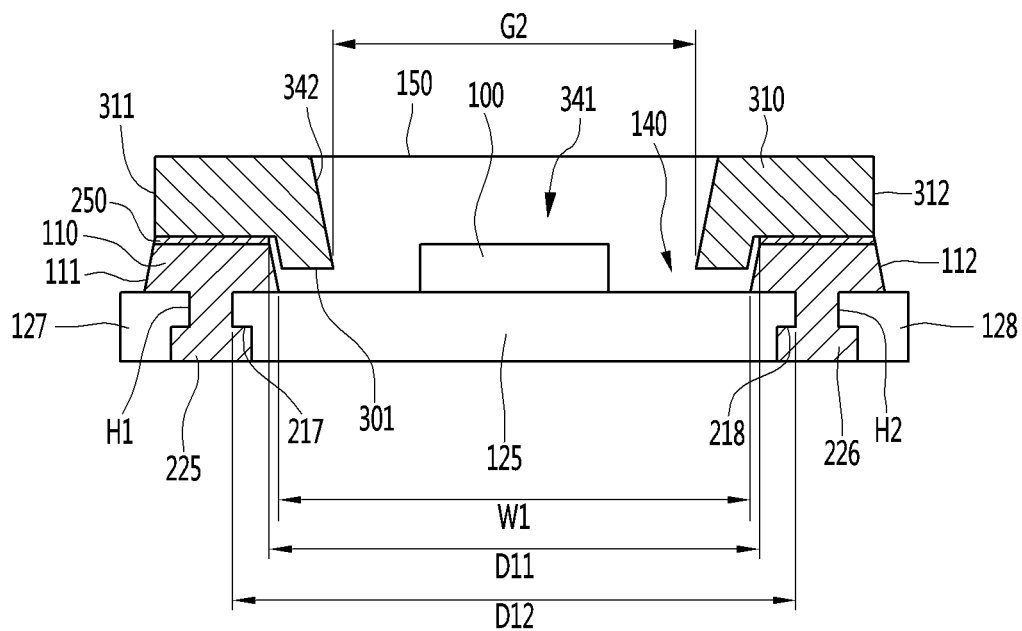
FIG. 10 is a sectional view taken along line B-B of the light emitting device of FIG. 1.
Figure 11:
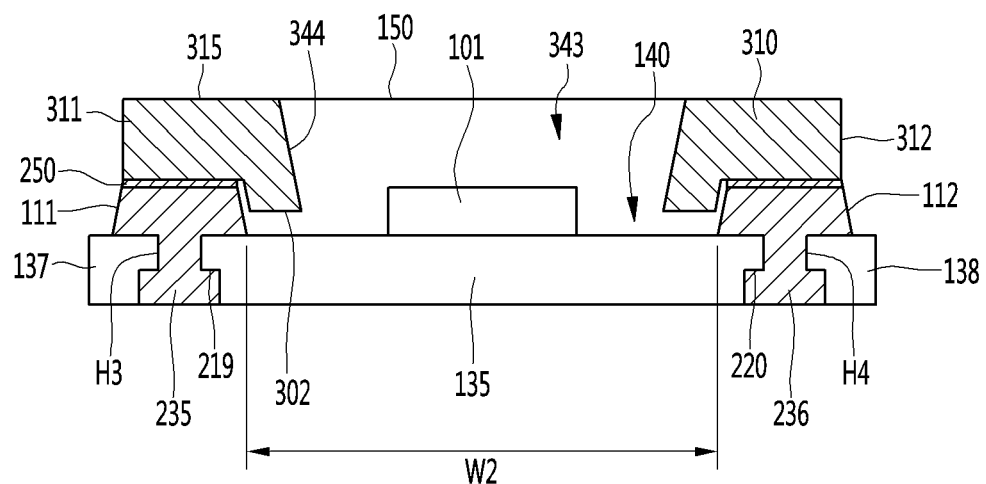
FIG. 11 is a sectional view taken along line C-C of the light emitting device of FIG. 1.
Figure 12:
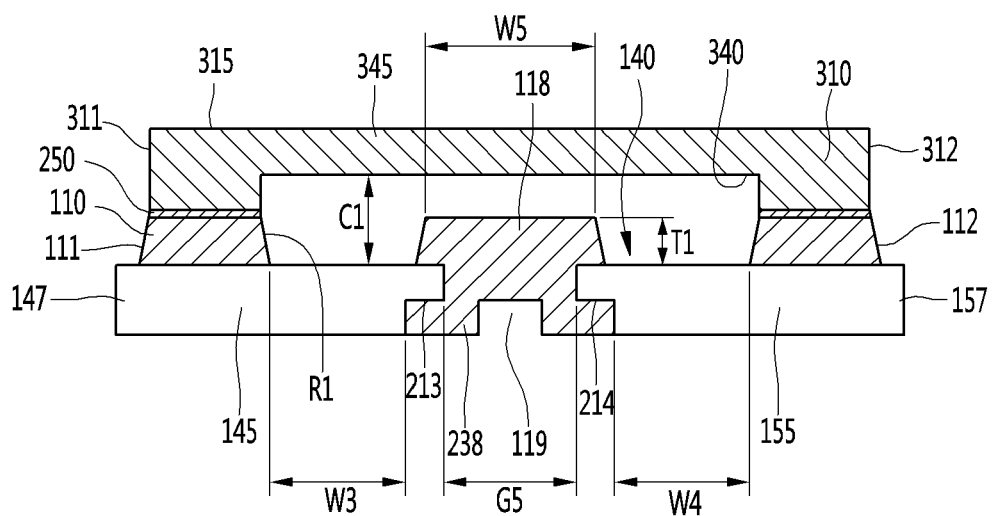
FIG. 12 is a sectional view taken along line D-D of the light emitting device of FIG. 1.

FIG. 1 is a perspective view showing a light emitting device according to an embodiment. FIG. 2 is a perspective view showing a bottom surface of the light emitting device of FIG. 1. FIG. 3 is a view showing the light emitting device having no reflective frame of FIG. 2. FIG. 4 is a bottom view showing the light emitting device of FIG. 3. FIG. 5 is a perspective view showing the reflective frame of FIG. 2. FIG. 6 is a plan view showing the reflective frame of FIG. 5. FIG. 7 is a bottom view showing the reflective frame of FIG. 6. FIG. 8 is a sectional view taken along line A-A of the light emitting device of FIG. 1. FIG. 9 is a partial enlarged view of FIG. 8. FIG. 10 is a sectional view taken along line B-B of the light emitting device of FIG. 1. FIG. 11 is a sectional view taken along line C-C of the light emitting device of FIG. 1. FIG. 12 is a sectional view taken along line D-D of the light emitting device of FIG. 1.

Referring to FIGS. 1 to 12, a light emitting device 300 may include a body 110, a plurality of lead frames 125,135, 145, and 155, at least a portion of which may be coupled to the body 110, a plurality of light emitting chips 100 and 101 provided on mutually different lead frames 125 and 135 among the plurality of lead frames 125,135,145, and 155, and a reflective frame 310 provided on the body 110. At least two of the plurality of lead frames 125, 135, 145, and 155 may be coupled to the body 110, and at least one or a plurality of light emitting chips 100 and 101 may be provided in at least two of the plurality of lead frames 125, 135, 145, and 155. For convenience of explanation, an embodiment providing at least two lead frames, for example, four lead frames, may be described.

The body 110 may be formed of an insulating reflective material, and the reflective material may be formed of a material having a reflective index, for example, a reflective index of at least 70%, higher than transmittance with respect to wavelengths emitted from the light emitting chips 100 and 101. When the reflective index is at least 70%, the body 110 may be formed of a non-transmissive material. The body 110 may be formed of a resin-based insulating material, for example, a resin material, such as polyphthalamide (PPA). The body 110 may include thermosetting resin including silicon, epoxy resin, thermosetting resin such as a plastic material, a high heat resistance material, or a high light resistance material. The body 110 based on the silicon-based material may include white-based resin. The body 110 may include acid anhydride, an antioxidant, a release agent, an optical reflector, an inorganic filling agent, a curing catalyst, a light stabilizer, a lubricant, or a titanium dioxide. The body 110 may be molded by using at least one selected from a group consisting of epoxy resin, modified epoxy resin, silicon resin, modified silicon resin, acrylic resin, and urethane resin. For instance, the body 110 may be formed by using B-stage solid epoxy resin composition, which may be obtained by mixing epoxy resin, such as, e.g., triglycidylisocyanurate or hydride bisphenol A diglycidylether, with the acid anhydride promoter, such as, e.g., hexahydro phthalic anhydride, 3-methyl hexahydro phthalic anhydride or 4-methyl hexahydro phthalic anhydride, and then partially hardening this mixture after adding DBU(1,8-Diazabicyclo (5,4,0)undecene-7) serving as a hardening accelerator and ethylene glycol, titanium oxide pigment, or glass fiber serving as a promoter to the epoxy resin, but the embodiment is not limited thereto. In addition, the body 110 may include a mixture of the thermosetting resin and at least one selected from a group consisting of a diffusing agent, a pigment, a fluorescent material, a reflective material, a light-shielding material, a light stabilizer, and a lubricant. The body 110 may include a reflective material, for example, a resin material formed by adding a metallic oxide to a resin material such as epoxy or silicon, and the metallic oxide may include at least one of $TiO_2$, $SiO_2$, and $Al_2O_3$. The body 110 may effectively reflect incident light. Alternatively, the body 110 may be formed of a transmissive resin material or a resin material having a phosphor to convert the wavelength of the incident light.

As shown in FIGS. 3 and 4, the body 110 may include a plurality of outer surfaces, for example, at least four lateral side portions 111, 112, 113, and 114. At least one or all of the four lateral side portions 111, 112, 113, and 114 may be inclined with respect to a bottom surface of the body 110. Regarding the first to fourth lateral side portions 111, 112, 113, and 114 of the body 110, the first and second lateral side portions 111 and 112 may be located or provided opposite each other, and the third and fourth lateral side portions 113 and 114 may be located or provided opposite each other. The first and second lateral side portions 111 and 112 may have a second length D2, and the second length D2 may be a maximum length of the first and second lateral side portions 111 and 112. The third and fourth lateral side portions 113 and 114 may have a first length D1, and the first length D1 may be a maximum length of the third and fourth lateral side portions 113 and 114. The second length D2 may be different from the first length D1. The second length D2 may be longer than the first length D1, for example, one time to three times longer than the first length D1. The first and second lateral side portions 111 and 112 may be lateral sides longer than lateral sides of the third and fourth lateral side portions 113 and 114, and the third and fourth lateral side portions 113 and 114 may be lateral sides shorter than lateral sides of the first and second lateral side portions 111 and 112.

The second length D2 of the first lateral side portion 111 or the second lateral side portion 112 may be at a maximum interval between the third lateral side portion 113 and the fourth lateral side portion 114. A longitudinal direction of the body 110 may be defined as a first axial (X) direction, and a transversal direction of the body 110 may be defined as a second axial (Y) direction, which may be perpendicular to the first axial (X) direction. Corner portions, which may be boundary regions of the first to fourth lateral side portions 111, 112, 113, and 114, may be angled or curved, but the embodiment is not limited thereto.

A length of the body 110, which may be an extension length in the first axial (X) direction, may be the second length D2 of the first and second lateral side portions 111 and 112. A width of the body 110, which may be an extension length in the second axial (Y) direction, may be the first length D1. The second length D2 of the body 110 may range from one time to three times longer than the first length D1. For example, the second length D2 may range from 1.3 times to two times longer than the first length D1. If the second length D2 exceeds three times the first length D1, stiffness of a boundary region among the lead frames 125, 135, 145, and 155 may be reduced. If the second length D2 is equal to or less than one time longer than the first length D1, a plurality of light emitting chips having large areas may not be provided in one light emitting device. In this case, each of the light emitting chips 100 and 101 may be a chip having a width and a height of at least 0.6 mm, for example, at least 1 mm. The chip having the above size may be a large-area chip. Since the second length D2 of the first body 110 is equal to or less than three times the first length D1, an intermediate portion of the body 110 may be prevented from being bent or broken in a manufacturing process, such as, for example, an injection molding process.

The body 110 may include a cavity 140 having an open upper portion. The lead frames 125, 135, 145, and 155 may be provided on a bottom of the cavity 140. Top surfaces of the lead frames 125, 135, 145, and 155 may be provided lower than a top surface 115 of the body 110. As shown in FIGS. 8 to 12, an inner sidewall R1 of the cavity 140 may be inclined or perpendicular to the flat bottom surface of the body 110. The inner sidewall R1 may further include a perpendicular surface between the inclined surface and the top surface of the lead frames 125, 135, 145, and 155.

As shown in FIGS. 1 and 3, the first lead frame 125 may be coupled to an adjacent region to or of the third lateral side portion 113 of the body 110, and the second lead frame 135 may be coupled to an adjacent region to or of the fourth lateral side portion 114 of the body 110. The body 110 may have the cavity 140 lower than the top surface 115 of the body 110, and the cavity 140 may be recessed from the body 110, but the embodiment is not limited thereto. The lead frames 125, 135, 145, and 155 may be provided on the bottom surface of the cavity 140. The lead frames 125, 135, 145, and 155 may include the first lead frame 125 provided at a first region of the cavity 140, the second lead frame 135 provided at a second region of the cavity 140, and the third and fourth lead frames 145 and 155 provided at a center of the cavity 140, that is, at a third region between the first and second regions.

A portion of the top surfaces of the first to fourth lead frames 125, 135, 145, and 155 may be exposed through the bottom surface of the cavity 140. The first lead frame 125 may be exposed through the first region of the cavity 140, and the second lead frame 135 may be exposed through the second region of the cavity 140. The third and fourth lead frames 145 and 155 may be exposed through the center region of the cavity 140. The first region of the cavity 140 may be adjacent to the first, second, and third lateral side portions 111, 112, and 113 of the body 110. The second region of the cavity 140 may be adjacent to the first, second, and fourth lateral side portions 111, 112, and 114 of the body 110.

Each of the first and second lead frames 125 and 135 may be arranged in the second axial (Y) direction of the body 110. The third and fourth lead frames 145 and 155 may be arranged in line with each other in the second axial (Y) direction of the body 110. The first and second lead frames 125 and 135 may be arranged in parallel to each other. The first and second lead frames 125 and 135 may have a length D21 longer than the extension length in the second axial (Y) direction of the body 110. If the first and second lead frames 125 and 135 are arranged in the first axial (X) direction of the body 110, one lead part or portion may protrude from the third and fourth lateral side portions 113 and 114 of the body 110, and a space to place the third and fourth lead frames 145 and 155 may not be ensured. In addition, heat radiation areas of the first and second lead frames 125 and 135 on which the light emitting chips 100 and 101 may be arranged may not be ensured, and heat radiation efficiency may be degraded.

The first and second lead frames 125 and 135 according to the embodiment, which may be provided under the light emitting chips 100 and 101, may extend in a width direction, or the second axial (Y) direction, and a plurality of lead parts or lead portions 127, 128, 137, and 138 may protrude from the first and second lateral side portions 111 and 112 of the body 110. Accordingly, the first and second lead frames 125 and 135, on which the light emitting chips 100 and 101 may be provided, may be arranged in an axial direction perpendicular to the second length D2 of the body 110, for example, the second axial (Y) direction, thereby ensuring a heat radiation area, and improving the heat radiation efficiency of the light emitting device 300.

As shown in FIGS. 1 to 4 and FIG. 10, the first lead frame 125 may be coupled to the body 110 and arranged under the first region of the cavity 140. The first lead frame 125 may include the first and second lead parts 127 and 128 protruding from lateral side portions of the body 110 opposite to each other. The first lead part 127 may protrude from the first lateral side portion 111 of the body 110, and the second lead part 128 may protrude from the second lateral side portion 112 of the body 110. Since the first lead frame 125 has first and second lead parts 127 and 128 protruding in a shorter axis direction of the body 110, the heat radiation area may be improved. Since the first lead frame 125 having the first and second lead parts 127 and 128 has a length D21 longer than the first length D1 of the body 110, a bonding area and electrical reliability may be improved.

As shown in FIGS. 8 and 10, a length L1 or a width W1 of the first lead frame 125 exposed to the cavity 140 may be uniform or varied. For example, the length L1 or the width W1 may be 1.0 mm or more, for example, a range of about 1.0 mm to 3.5 mm. If the length L1 or the width W1 is less than this range, the first light emitting chip 100 may not be mounted, and if the length L1 or the width W1 is greater than this range, package size may increase.

As shown in FIGS. 1 to 4, and FIG. 11, the second lead frame 135 may be provided under the second region of the cavity 140, and coupled to the body 110. The second lead frame 135 may include the third and fourth lead parts 137 and 138 protruding to opposite lateral side portions of the body 110. The third lead part 137 may protrude from the first lateral side portion 111 of the body 110, and the fourth lead part 138 may protrude from the second lateral side portion 112 of the body 110. Since the second lead frame 135 has the third and fourth lead parts 137 and 138 protruding in the shorter axis direction of the body 110, the heat radiation area may be improved. Since the second lead frame 135 having the third and fourth lead parts 137 and 138 has a length D21 longer than the first length D1 of the body 110, the bonding area and electrical reliability may be improved.

As shown in FIGS. 8 and 11, a length L2 or a width W2 of the second lead frame 135 exposed to the cavity 140 may be uniform or varied. For example, the length L2 or the width W2 may be 1.0 mm or more, for example, a range of about 1.0 mm to 3.5 mm. If the length L2 or the width W2 is less than this range, the second light emitting chip 101 may not be mounted, and if the length L2 or the width W2 is greater than this range, package size may increase. The length L2 may be equal to or different from the length L1 of the first lead frame 125. For example, the ratio of L1:L2 may be in a range of 3:1 to 1:3, but the embodiment is not limited thereto.

As shown in FIGS. 1 to 4, and FIG. 12, the third lead frame 145 may be provided between the first and second lead frames 125 and 135, and may include a fifth lead part 147 protruding from one of the first and second lateral side portions 111 and 112 of the body 110. For example, the fifth lead part 147 may protrude from the first lateral side portion 111 of the body 110, and may be provided between the first and third lead parts 127 and 137. As shown in FIGS. 8 and 12, a length L3 of the third lead frame 145 exposed to the cavity 140 may be 120 μm or more, for example, 150 μm or more. If the length L3 is less than the above value, a bonding process of a first protective chip 102 may be difficult. A width W3 of the third lead frame 145 exposed to the cavity 140 may be greater than the length L3 of the third lead frame 145, and a bonding space for a wire to be bonded to the first protective chip 102 may be provided.

Since the fifth lead part 147 makes contact with the body 110 with a width greater than a width of an inner part of the third lead frame 145, a contact area between the fifth lead part 147 and the body 110 may increase, and a coupling strength between the fifth lead part 147 and the body 110 may be enhanced. Accordingly, separation of the third lead frame 145 may be prevented. The inner part of the third lead frame 145 may be the bottom surface of the cavity 140.

The fourth lead frame 155 μm provided at a region between the first and second lead frames 125 and 135, and may include a sixth lead part or portion 157 protruding from another of the first and second lateral side portions 111 and 112 of the body 110. For example, the sixth lead part 157 may protrude from the second lateral side portion 112 of the body 110, and may be provided between the second and fourth lead parts 128 and 138. A length of the fourth lead frame 155 exposed to the cavity 140 may be equal to the length L3 of the third lead frame 145. A width W4 of the fourth lead frame 155 exposed to the cavity 140 may be equal to the width W3 of the third lead frame 145. Since the sixth lead part 157 makes contact with the body 110 with a width greater than the width of the inner part of the fourth lead frame 155, the contact area between the sixth lead part 157 and the body 110 may increase, and a coupling strength between the sixth lead part 157 and the body 110 may be enhanced. Accordingly, separation of the fourth lead frame 155 may be prevented. The inner part of the fourth lead frame 155 may be the bottom surface of the cavity 140.

As shown in FIGS. 3 and 4, the first, third, and fifth lead parts 127, 137, and 147 may protrude outward from the first lateral part 111, and the second, fourth, and sixth lead parts 128, 138, and 157 may protrude outward from the second lateral part 112. The first, third, and fifth lead parts 127,137, 147 may protrude in a direction opposite to a direction of the first, third, and fifth lead parts 127, 137, and 147. The lead parts 127, 137, and 147 protruding to the first lateral side portion 111 of the body 110 and the lead parts 128, 138, and 157 protruding to the second lateral side portion 112 may serve as test terminals or bonding terminals.

Intervals K1 and K2 between the first and third lead parts 127 and 137, and between the third lead part 137 and fifth lead part 147 protruding from the first lateral side portion 111 may be equal to or different from each other, and may be wider than widths G3 and G4 of first and second gap parts or portions 116 and 117. Intervals between the second and fourth lead parts 128 and 138, and between the fourth lead part 138 and 157, the second, fourth, and sixth lead parts 128, 138, and 157 protruding from the second lateral side parts or portions 116 and 117, may be equal to or different from each other. As shown in FIG. 8, the intervals between the second and fourth lead parts 128 and 138, and between the fourth lead part 138 and 157 may be wider than the widths G3 and G4 of the first and second gap parts 116 and 117. The widths G3 and G4 between adjacent lead parts may be narrower than widths D7, D8, D9 of the lead parts 127, 128, 137, 138, 147, and 157. The widths D7 and D8 may be widths of the first to fourth lead parts 127, 128, 137, and 138, but the embodiment is not limited thereto. A ratio of the widths D7 and D8 of the first to fourth lead parts 127, 128, 137, and 138 to the width D9 of the fifth and sixth lead parts 147 and 157 may be in a range of 2:1 to 1:1. The above ratio may prevent the heat radiation area from being reduced due to an area of the first to fourth lead parts 127, 128, 137, and 138, and may prevent the fifth and sixth lead parts 156 and 157 from malfunctioning.

As shown in FIGS. 1 to 4 and FIG. 8, bottom surfaces of the first to fourth lead frames 125, 135, 145, and 155 may be arranged on a same plane as that of the first to sixth lead parts 127, 128, 137, 138, 147, and 157. The bottom surfaces of the first to fourth lead frames 125, 135, 145, and 155 may be exposed to the bottom surface of the body 110. The first to sixth lead parts 127, 128, 137, 138, 147, and 157 may be arranged on the same plane as the bottom surface of the body 110. The bottom surfaces of the first to sixth lead parts 127, 128, 137, 138, 147, and 157 may be exposed outward from the bottom surface of the body 110. The first to fourth lead frames 125, 135, 145, and 155 may be bonded to a circuit board together with the first to sixth lead parts 127, 128, 137, 138, 147, and 157. The first to sixth lead parts 127, 128, 137, 138, 147, and 157 may protrude by at least 0.10 mm, for example, at least 0.15 mm from each of the lateral side portions 111 and 112 of the body 110. The protruding lengths of the first to sixth lead parts 127, 128, 137, 138, 147, and 157 may function as test terminals or lead terminals. The first to fourth lead frames 125, 135, 145, and 155 may include a metallic material, for example, at least one of titanium (Ti), copper (Cu), nickel (Ni), gold (Au), chrome (Cr), tantalum (Ta), platinum (Pt), tin (Sn), silver (Ag), and phosphorus (P). The first to fourth lead frames 125, 135, 145, and 155 may be formed at a single metallic layer or a multi-metallic layer. The first to fourth lead frames 125, 135, 145, and 155 may have equal thicknesses. The first to fourth lead frames 125, 135, 145, and 155 may function as a terminal to supply power.

The light emitting device 300 according to the embodiment may include a plurality of light emitting chips 100 and 101. At least one of light emitting chips 100 and 101 may be provided on at least one lead frame. The light emitting chips 100 and 101 may include the first and second light emitting chips 100 and 101. The first light emitting chip 100 may be provided on the first lead frame 125 in the cavity 140, and the second light emitting chip 101 may be provided on the second lead frame 135 in the cavity 140. The first light emitting chip 100 may be bonded to the first lead frame 125 by an adhesive, for example, a conductive adhesive, to be electrically connected with the first lead frame 125. The first light emitting chip 100 may be connected with the third lead frame 145 through a first connection member or connector 171, and the first connection member 171 may include a conductive wire. The conductive adhesive may include a bonding material such as solder. The second light emitting chip 101 may be bonded onto the second lead frame 135 with an adhesive, for example, a conductive adhesive to be electrically connected to the second lead frame 135. The second light emitting chip 101 may be connected with the second lead frame 135 through a second connection member or connector 172. The second connection member 172 may include a conductive wire.

The first and second light emitting chips 100 and 101 may selectively emit light from a visible light band to an ultraviolet band. For example, the first and second light emitting chips 100 and 101 may include one selected from among a red LED chip, a blue LED chip, a green LED chip, a yellow green LED chip, and a white LED chip. The first and second light emitting chips 100 and 101 may include LED chips including at least one of compound semiconductors of group II-V elements and compound semiconductors of group II-VI elements. The light emitting device 300 may include the first and second light emitting chips 100 and 101 having large areas, for example, at least 0.6 mm×0.6 mm or 1 mm×1 mm, in order to improve light intensity. The light emitting chips 100 and 101 may be realized with light emitting diodes, and the light emitting diodes may include other semiconductor devices, for example, a Zener diode, a field-effect transistor (FET) or a junction field-effect transistor (JFET).

The light emitting device 300 according to the embodiment may include a plurality of protection chips 102 and 103. The plurality of protection chips 102 and 103 may include a first protective chip 102 provided on the third lead frame 145 and a second protective chip 103 provided on the fourth lead frame 155, among the lead frames 125, 135, 145, and 155. The first protection chip 102 may be bonded onto the third lead frame 145 using the conductive adhesive so as to be electrically connected with the third lead frame 145, and may be connected with the first lead frame 125 through a third connection member 173. The connection member 173 may include a conductive wire. The second protection chip 103 may be bonded onto the fourth lead frame 155 using the conductive adhesive so as to be electrically connected with the fourth lead frame 155, and may be connected with the second lead frame 135 through the fourth connection member 174. The connection member 174 may include a conductive wire.

The first and second protection chips 102 and 103 may be realized with at least one of a thyristor, a Zener diode or a transient voltage suppression (TVS). The first light emitting chip 100 may be connected in parallel with the first protective chip 102, and the second light emitting chip 101 may be connected in parallel with the second protection chip 103. The first and second lead frames 125 and 135 may function as cathodes of the light emitting chips 100 and 101, and the third and fourth lead frames 145 and 155 may function as anodes of the light emitting chips 100 and 101. The first and second protection chips 102 and 103 may electrically protect the first and second light emitting chips 100 and 101. Surfaces of the first and second protection chips 102 and 103 may be provided thereon with a reflective material. The reflective material may include a resin material, such as silicon or epoxy, containing a metallic oxide, for example, at least one of $TiO_2$, $SiO_2$, and $Al_2O_3$. The reflective material may prevent light from being absorbed into the first and second protection chips 102 and 103.

In the cavity 140, an interval between the inner sidewall 141, onto which the third lead frame 145 may be coupled, and the first lateral side portion 111 may be narrower than an interval between the inner sidewall, onto which the first or second lead frame 125 or 135 may be coupled, and the first lateral side portion 111. A width of a top surface of the body 110 through which the third lead frame 145 may pass may be narrower than a width of the top surface of the body 110 through which the first and second lead frames 125 and 135 may pass. An area of a top surface of the third lead frame 145 may be ensured in the cavity 140 so that a space for a stitch bonding process of the first protection chip 102 may be provided. An interval between the inner sidewall 142, onto which the fourth lead frame 155 may be coupled, and the second lateral side portion 112 may be narrower than an interval between the inner sidewall onto which the first or second lead frame 125 or 135 may be coupled and the second lateral side portion 112. In other words, a width of the top surface of the body 110 through which the fourth lead frame 155 may pass may be narrower than a width of the top surface of the body 110 through which the first and second lead frames 125 and 135 may pass. An area of a top surface of the fourth lead frame 155 may be ensured in the cavity 140 so that a space for a stitch bonding process of the second protection chip 103 may be provided.

As shown in FIGS. 2, 3, 8, and 9, the first gap part 116 may be coupled to the region between the first lead frame 125 and the third and fourth lead frames 145 and 155. The first gap part 116 may be formed of a material the same as or different from a material of the body 110. The second gap part 117 may be coupled to the region between the second lead frame 135, and the third and the fourth lead frames 145 and 155. The second gap part 117 may be formed of a material the same as that of the body 110, or may include an insulating material different from that of the body 110. The first and second gap portions 116 and 117 may be connected to each other.

As shown in FIGS. 3 and 12, a protrusion 118 may protrude in a region between the first and second gap parts 116 and 117. The protrusion 118 may be formed of a material the same as materials of the first and second gap parts 116 and 117, and may be connected with the first and second gap parts 116 and 117. The protrusion 118 may be integrated with the body 10. The protrusion 118 may be provided at a region between the third and fourth lead frames 145 and 155. The protrusion 118 may extend from portions of top surfaces of the third and fourth lead frames 145 and 155, and may have an inclined circumferential surface. The protrusion 118 may be coupled to the third and fourth lead frames 145 and 155, and may be overlapped with the portions of the top surfaces of the third and fourth lead frames 145 and 155 in a vertical direction. The protrusion 118 may have at least one of a circular shape, a polygonal shape, an oval shape, and a shape in which edges of a polygon may be rounded, but the embodiment is not limited thereto. The protrusion 118 may protrude in a shape of a prism having a width narrowed toward a top surface of the protrusion 118. In addition, when a lateral side of the protrusion 118 is curved, incident light may be reflected in a different direction. The lateral side of the protrusion 118 may be provided in a curved shape instead of an angled surface for light reflection.

A concave part or portion 119 may be provided opposite the protrusion 118. The concave part 119 may be a hole for an injection gate to be coupled in an injection molding process. The concave part 119 may have a polygonal shape or a semi-spherical shape when viewed as a side cross-section, but the embodiment is not limited thereto. A depth of the concave part 119 may be lower than depths of the top surfaces of the third and fourth lead frames 145 and 155. When a recess region 340 is formed to depths of the top surfaces of the third and fourth lead frames 145 and 155, stiffness of the first and second gap parts 116 and 117 may be reduced.

The protrusion 118 may protrude with a predetermined thickness T1, and the thickness T1 may be equal to or higher than heights of the top surfaces of the first and second protection chip 102 and 103. A top surface of the protrusion 118 may be provided lower than the top surfaces of the third and fourth lead frames 145 and 155, and may be lower than a top surface 115 of the body 110. The top surface of the protrusion 118 may be provided higher than the top surface of the first gap part 116 and second gap part 117. If the protrusion 118 does not protrude, coupling strength between the third and fourth lead frames 145 and 155 may be degraded or removed. In addition, if the protrusion 118 is thicker than the thickness T1, the protective chips 102 and 103 may not be mounted. As shown in FIG. 7, a width W5 of the protrusion 118 may be narrower than the widths W3 and W5 of the third and fourth lead frames 145 and 155 exposed to the bottom surface of the cavity 140. In the protrusion 118, a ratio of the length to the width may be in the range of 3:1 to 1:3, but the embodiment is not limited thereto. The protrusion 118 and the first and second gap parts 116 and 117 may be coupled to the third and fourth lead frames 145 and 155 to support the third and fourth lead frames 145 and 155. The protrusion 118 may be located at a center of the first and second lead frames 125 and 135, and at a center between the third and fourth lead frames 145 and 155.

As shown in FIGS. 3, 4, and 8, the first lead frame 125 may have first and second stepped structures 211 and 212 at an outer circumference thereof. The first and second stepped structures 211 and 212 may be coupled to a portion of the body 110. The first and second stepped structures 211 and 212 may be provided at both outer portions of the first lead frame 125, for example, along both edges of the first lead frame 125. The first stepped structure 211 may be coupled to an inner part of the third lateral side part 113 in a width direction of the body 110. The first stepped structure 211 may extend in the first and second lateral side portions 111 and 112 of the body 110. The second stepped structure 212 may be coupled to the first gap part 116 along the first gap part 116. The first stepped structure 212 may extend in the first and second lateral side portions 111 and 112 of the body 110. Depths of the first and second stepped structures 211 and 212 may be formed at 0.01 mm or more, for example, 0.02 mm or more from an edge of the first lead frame 125. If the depths are less than the above numerical values, the coupling strength may be degraded. Recess heights of the first and second stepped structures 211 and 212 may be in a range of ⅓ to ½ of a thickness of the first lead frame 125. When the recess heights of the first and second stepped structures 211 and 212 are out of this range, the coupling strength may be degraded, or the stepped portion may be broken.

The first and second stepped structures 211 and 212 may include step structures. Alternatively, the first and second stepped structures 211 and 212 may include inclination surfaces formed in an oblique shape or a curved shape, but the embodiment is not limited thereto. A length D13 of the first and second stepped structures 211 and 212 may be greater than a width D11 of the cavity 140 of FIG. 3. The width D11 of the cavity 140 may be a width of an upper area adjacent to an adhesive layer 250. Accordingly, the first and second stepped structures 211 and 212 may increase a contact area with the body 110. The length D13 of the first and second stepped structures 211 and 212 may be shorter than the first length D1 of the body 110. The body 110 of the first and second stepped structures 211 and 212 may be spaced from surfaces of the first and second lateral side portions 111 and 112 of the body 110.

A bottom width D3 of the first lead frame 125 may be narrower than a top width of the first lead frame 125. The top width of the first lead frame 125 may be wider than a bottom width of the first lead frame 125. The bottom width D3 of the first lead frame 125 provided in the cavity 140 may be wider than the width D7 of the third and fourth lead parts 127 and 128. A difference between the bottom width D3 and the width D7 in the first lead frame 125 may be at least 0.05 mm, for example, in a range of 0.05 mm to 0.2 mm. If the difference is less than this range, the coupling strength between the first lead frame 125 and the body 110 may be degraded. If the difference is greater than the range, the first and second lead parts 127 and 128 may malfunction. The first and second lead parts 127 and 128 may protrude with the width D7 narrower than the bottom width D3 of the first lead frame 125 provided under the body 110, thereby preventing the stiffness of the first and second lateral side portions 111 and 112 of the body 110 from being degraded.

The second lead frame 135 may have third and fourth stepped structures 215 and 216 at an outer circumference thereof, and the third and fourth stepped structures 215 and 216 may be coupled to a portion of the body 110. The third and fourth stepped structures 215 and 216 may be provided at both outer portions of the second lead frame 135, for example, along both edges of the second lead frame 135. The third stepped structure 215 may be coupled to an inner part of the fourth lateral side portion 114 along the fourth lateral side portion 114. The third stepped structure 215 may extend in the first and second lateral side portions 111 and 112 of the body 110. The fourth stepped structure 216 may be coupled to an inner part of the second gap part 117 along the second gap part 117. The fourth stepped structure 216 may extend in the first and second lateral side portions 111 and 112 of the body 110. Depths of the third and fourth stepped structures 215 and 216 may be formed at 0.01 mm or more, for example, 0.02 mm or more from the edge of the second lead frame 135. If the depths are less than the above numerical values, the coupling strength may be degraded. Recess heights of the third and fourth stepped structures 215 and 216 may be in a range of ⅓ to ½ of a thickness of the second lead frame 135. When the recess heights of the third and fourth stepped structures 215 and 216 are out of this range, the coupling strength may be degraded, or the stepped portion may be broken.

The third and fourth stepped structures 215 and 216 may include step structures. Alternatively, the third and fourth stepped structures 215 and 216 may include inclination surfaces formed in an oblique shape or a curved shape, but the embodiment is not limited thereto. The length D13 of the third and fourth stepped structures 215 and 216 may be longer than the width D11 of the cavity 140 of FIG. 3, and shorter than the first length D1 of the body 110. Accordingly, the third and fourth stepped structures 215 and 216 may increase a contact area with the body 110 due to the length D13. The third and fourth stepped structures 215 and 216 may be spaced from surfaces of the first and second lateral side portions 111 and 112 of the body 110.

A bottom width D4 of the second lead frame 135 may be narrower than a top width of the second lead frame 135. The top width of the second lead frame 135 may be wider than the bottom width of the second lead frame 135. The bottom width D4 of the second lead frame 135 provided in the cavity 140 may be wider than the width D8 of the third and fourth lead parts 137 and 138. The first and second lead frames 125 and 35 may extend with lengths longer than the first length D1 of the body 110 in the width direction of the body 110. Accordingly, each of the first and second lead frames 125 and 135 may have the lead parts 127, 128, 137, and 138 protrude through mutually different lateral sides so that the heat radiation efficiency may be improved.

Referring to FIGS. 3, 4, and 12, the third lead frame 145 may include a fifth stepped structure 213 at an outer circumference thereof. One fifth stepped structure 213 or a plurality of fifth stepped structures 213 may be provided at an outer circumference of the third lead frame 145 and coupled to a portion of the body 110. The fifth stepped structure 213 may be coupled to the first and second gap parts 116 and 117 and the protrusion 118. The third lead frame 145 may have a top surface area wider than a bottom surface area due to the fifth stepped structure 213. The fifth stepped structure 213 may be spaced apart from a surface of the first lateral side portion 111 of the body 110. A depth of the fifth stepped structure 213 may be formed at 0.01 mm or more, for example, 0.02 mm or more from the edge of the third lead frame 145. If the depths are less than the above numerical values, the coupling strength may be degraded. A recess height of the fifth stepped structure 213 may be in the range of ⅓ to ½ of a thickness of the third lead frame 145. When the recess height is out of this range, the coupling strength may be degraded, or the stepped portion may be broken. The fifth stepped structure 213 may include a step structure. Alternatively, the fifth stepped structure 213 may include an inclination surface formed in an oblique shape or a curved shape, but the embodiment is not limited thereto.

The fourth lead frame 155 may include a sixth stepped structure 214 at an outer circumference thereof. One sixth stepped structure 214 or a plurality of fifth stepped structures 213 may be provided at an outer circumference of the fourth lead frame 155 and coupled to a portion of the body 110. The sixth stepped structure 214 may be coupled to the first and second gap parts 116 and 117 and the protrusion 118. The fourth lead frame 155 may have a top surface area wider than a bottom surface area due to the sixth stepped structure 214. A depth of the sixth stepped structure 214 may be formed at 0.01 mm or more, for example, 0.02 mm or more from the edge of the fourth lead frame 155. If the depths are less than the numerical values, the coupling strength may be degraded. A recess height of the sixth stepped structure 214 may be in the range of ⅓ to ½ of a thickness of the fourth lead frame 155. When the recess height is out of this range, the coupling strength may be degraded, or the stepped portion may be broken. The sixth stepped structure 214 may include a step structure. Alternatively, the sixth stepped structure 214 may include an inclination surface formed in an oblique shape or a curved shape, but the embodiment is not limited thereto.

The stepped structures 211, 212, 213, 214, 215, and 216 of the first to fourth lead frames 125, 135, 145, and 155 may improve the coupling strength with the body 110 to prevent moisture from infiltrating into the light emitting device. A bottom width D5 of the third and fourth lead frames 145 and 155 may be narrower than the width D9 of the fifth and sixth lead parts 147 and 147. A difference between the bottom width D5 and the width D9 in the third and fourth lead frames 145 and 155 may be 0.5 mm or more, for example, in a range of 0.05 mm to 0.2 mm. If the difference is less than the above range, the coupling strength with the body 110 may be degraded. If the difference is more than the above range, the fifth and sixth lead parts 147 and 157 may malfunction.

In the bottom surfaces of the third and fourth lead frames 145 and 155, the bottom width D5, which may serve as an inner width, may be at least 0.03 mm, for example, range from 0.03 mm to 1.0 mm or range from 0.4 mm to 0.6 mm, and the width D9, which may serve as an outer width, may be at least 0.08 mm, for example, range from 0.08 mm to 1.2 mm. If the bottom width D5 is less than these ranges, the mounting process of the protection chips 102 and 103 or the wire bonding process may be difficult. If the bottom width D5 is greater than these ranges, the first and second gap parts 116 and 117 or the first and second lead frames 125 and 135 may be affected in size.

The bottom width D5 of the third and fourth lead frames 145 and 155 may be at most three times narrower than the widths D3 and D4 of the first and second lead frames 125 and 135. If the bottom width D5 of the third and fourth lead frames 145 and 155 is wider than the bottom widths D3 and D4 of the first and second lead frames 125 and 135, the widths of the first and second lead frames 125 and 135 may be decreased or the length of the body 110 may be increased.

The bottom widths D3 and D4 of the first and second lead frames 125 and 135 may be wider than the bottom width D5 of the fifth and sixth lead frames 145 and 155, and may be wider than the widths D7, D8, and D9 of the first to fourth lead parts 127, 128, 137, and 138. Alternatively, the bottom width D5 of the third and fourth lead frames 145 and 155 may be narrower than the bottom widths D3 and D4 of the first and second lead frames 125 and 135, and may be narrower than the fifth and sixth lead parts 145 and 157.

As shown in FIGS. 3, 4, and 10, the first lead frame 125 may be coupled to the body 110 and include a plurality of holes, for example, first and second holes H1 and H2 adjacent to the first and second lateral side portions 111 and 112. The interval D21 between the first and second holes H1 and H2 may be wider than the width D11 of the cavity 140. The first hole H1 may be provided adjacent to the first lateral side portion 111, and the second hole H2 may be provided adjacent to the second lateral side portion 112. The first and second holes H1 and H2 of the first lead frame 125 may contain seventh and eighth stepped structures 217 and 218, and the seventh and eighth stepped structures 217 and 218 may have top widths narrower than bottom widths. The first and second holes H1 and H2 may be provided such that the first and second holes H1 and H 2 may be vertically overlapped with the body 110 to enhance the coupling strength with the body 110. The first and second holes H1 and H2 may have at least one of a polygonal shape, a circular shape, an oval shape, and a shape in which edges of a polygon may be rounded when viewed from below. The first hole H1 may be provided in a rounded region M2 between the first stepped structure 211 and the second stepped structure 212, and the second hole H2 may be provided in a rounded region M3 between the first stepped structure 211 and the second stepped structure 212. The first lead frame 125 may enhance the coupling strength with the body 110 through the first and second holes H1 and H2 and the rounded regions M2 and M3. The first and second holes H1 and H2 may be spaced apart from lateral sides of the light emitting chips 100 and 101 and may have an interval wider than the length of one side of the light emitting chips 100 and 101.

The seventh and eighth stepped structures 217 and 218 may include step structures. Alternatively, the seventh and eighth stepped structures 217 and 218 may include inclination surfaces formed in an oblique shape or a curved shape, but the embodiment is not limited thereto. The first and second coupling structures or portions 225 and 226 of the body 110 may be coupled to the first and second holes H1 and H2 of the first lead frame 125. The first and second coupling structures 225 and 226 may be coupled to the first and second holes H1 and H2 such that bottom widths of the first and second coupling structures 225 and 226 may be wider than top widths. The seventh and eighth stepped structures 217 and 218 may have a predetermined height from a bottom surface of the first lead frame 125. For example, the height may be formed in a range of ⅓ to ½ of the thickness of the first lead frame 125. If the height is out of this range, the coupling strength with the body 110 may be degraded, or the stepped portion may be broken.

As shown in FIGS. 4 and 12, regarding an interval between the third and fourth lead frames 145 and 155, an interval G5 between top surfaces of the third and fourth lead frames 145 and 155 may be 0.8 mm±0.1 mm, and an interval between bottom surfaces of the third and fourth lead frames 145 and 155 may be 0.6 mm±0.05 mm. The intervals between the third and fourth lead frames 145 and 155 may remove electrical interference and may prevent the coupling strength between the third and fourth lead frames 145 and 155 and the protrusion 118 from being degraded.

As shown in FIG. 3, regarding the first and second lead frames 125 and 135, the regions M2 and M3 beyond the cavity 140 may extend in a rounded shape to the lead parts 127, 128, 137, and 138. In the third lead frame 145, a region M5 beyond the cavity 140 may extend in a rounded shape to the fifth lead part 147. In the fourth lead frame 155, a region M6 beyond the cavity 140 may extend in a rounded shape to the sixth lead part 157. Accordingly, the coupling strength between the third lead frame 145 and the body 110 may be increased due to the rounded regions M2, M3, M5, and M6. In this case, the round-shaped region M5 of the third lead frame 145 may be provided further out than the round-shaped regions M2 of the first and second lead frames 125 and 135, and the round-shaped region M6 of the fourth lead frame 155 may be provided further out than the round-shaped regions M of the first and second lead frames 125 and 135. In this case, a region between the regions M2 and M3 of the first and second lead frames 125 and 135 beyond the cavity 140 may be a non-rounded region M1.

As shown in FIGS. 4 and 11, the second lead frame 135 may be coupled to the body 110 and include a plurality of holes, for example the third and fourth holes H3 and H4, adjacent to the first and second lateral side portions 111 and 112. An interval between the third and fourth holes H3 and H4 may be wider than the width D11 of the cavity 140 shown in FIG. 3. The third and fourth holes H3 and H4 may vertically overlap with the body 110, thereby enhancing the coupling strength between the second lead frame 135 and the body 110. The third and fourth holes H3 and H4 may have at least one of a polygonal shape, a circular shape, an overall shape and a shape in which edges of a polygon may be rounded. The third hole H3 may be provided between round-shaped regions M2 of the third and fourth stepped structures 215 and 216, and the fourth hole H4 may be provided between round-shaped regions M3 of the third and fourth stepped structures 215 and 216. The coupling strength between the second lead frame 135 and the body 110 may be enhanced through the third and fourth holes H3 and H4 and the round-shaped regions M2 and M4. The third and fourth holes H3 and H4 may be spaced apart from both lateral sides of the second light emitting chip 101 by an interval D12 greater than a length of one side of the second light emitting chip 101.

The third and fourth holes H3 and H4 in the second lead frame contain ninth and tenth stepped structures 219 and 220, and the ninth and tenth stepped structures 210 and 220 may include a step structure. Alternatively, the ninth and tenth stepped structures 210 and 220 may have inclination surfaces formed in an oblique shape or a curved shape, but the embodiment is not limited thereto. The ninth and tenth stepped structures 219 and 220 may allow the third and fourth holes H3 and H4 to have bottom widths wider than upper widths. The third and fourth coupling parts or portions 235 and 236 may be coupled to the third and fourth holes H3 and H4 in the second lead frame 135, and coupled to the third and fourth holes H3 and H4 such that bottom widths of the third and fourth coupling parts 235 and 236 may be wider than top widths thereof.

The ninth and tenth stepped structure 219 and 220 may have predetermined heights from the bottom surface of the second lead frame 135. Recess heights of the ninth and tenth stepped structures 219 and 220 may be in the range of $1/3$ to $1/2$ of the thickness of the second lead frame 135. When the recess heights are out of this range, the coupling strength between the ninth and tenth stepped structures 219 and 220 and the body 110 may be degraded, or the stepped portion may be broken.

As shown in FIGS. 1, 2, and 7, the reflective frame 310 may be provided on the body 110. The reflective frame 310 may overlap with an entire portion of the top surface of the body 110. The reflective frame 310 may be provided on the first to fourth lead frames 125, 135, 145, and 155. The reflective frame 310 may be electrically insulated from at least one or all of the first to fourth lead frames 125, 135, 145, and 155.

Referring to FIG. 6, in the reflective frame 310, a length D22 in the first axial (X) direction may be at least one time, for example, in a range 1.3 times to two times longer than a length D23 in the second axial (Y) direction. When the reflective frame 310 is less than this range, sizes of openings 341 and 343 to output light may be reduced. When the reflective frame 310 is greater than this range, material may be wasted. The length D22 of the reflective frame 310 in the first axial (X) direction may be equal to or shorter than the second length D2 of the body 110. The length D23 of the reflective frame 310 in the second axial (Y) direction may be equal to or shorter than the first length D1 of the body 110. The length D22 of the reflective frame 310 in the first axial (X) direction may range from one time to three times longer than the length D23 in the second axial (Y) direction. The reflective frame 310 may prevent the stiffness from being weakened at the center of the body 110.

The adhesive layer 250 may be provided between the reflective frame 310 and the body 110. The adhesive layer 250 may attach the reflective frame 310 onto the top surface 115 of the body 110. The adhesive layer 250 may include an adhesive such as silicon or epoxy. The adhesive layer 250 may include a material the same as a material of the body 110. A portion of the reflective frame 310 may directly make contact with the body 110.

The reflective frame 310 may be formed of a metallic material. The reflective frame 310 may include at least one of Ag, Ni, Al, Rh, Pd, Ir, Ru, Mg, Zn, Pt, Cu, Au, and Hf, or the alloy selectively including the above materials. A light reflective index of the reflective frame 310 may be higher than a light reflective index of the body 110. The thickness of the reflective frame 310 may be 2 mm or less, for example, 1 mm or less, and may be thicker than thicknesses of the lead frames 125, 135, 145, and 155. The reflective frame 310 formed of the metallic material may not be twisted, and may have a thickness sufficient to be bonded onto the body 110.

As shown in FIG. 1, the reflective frame 310 may include a plurality of openings 341 and 343, for example, first and second openings 341 and 343. The first and second openings 341 and 343 may be separated from each other by a separation part or portion 345. The openings 341 and 343 may vertically overlap at least one of light emitting chips 100 and 101. The openings 341 and 343 may be holes through which the reflective frame 310 may pass in the directions of the light emitting chips 100 and 101. The first opening 341 may have a circular shape or a polygonal shape when viewed from above. The second opening 343 may have a circular shape or a polygonal shape when viewed from above.

The first opening 341 may be provided outside the first light emitting chip 100 to open an upper portion of the first light emitting chip 100. The second opening 343 may be provided outside the second light emitting chip 101 to open an upper portion of the second light emitting chip 101. The first opening 341 may be a region in which light emitted from the first light emitting chip 100 may be reflected and output. The second opening 343 may be a region in which light emitted from the light emitting chip 101 may be reflected and output.

As shown in FIGS. 6, 8, and 10, a lateral side 342 of the first opening 341 may face lateral sides of the first light emitting chip 100 while surrounding the upper portion of the first light emitting chip 100. A lower end 301 of the first opening 341 may be closer to the lateral side of the first light emitting chip 100 as the lower end 301 is closer to the first lead frame 125. Lower widths G1 and G2 of the first opening 341 may be wider than that of the top surface of the first light emitting chip 100, and may be narrower than the width W1 of the first lead frame 125 exposed onto the cavity 140. The lateral side 342 of the first opening 341 may have a surface inclined or perpendicular to a flat bottom surface of the body 110. In this case, the first opening 341 may be widened upward. Lower widths G1 and G2 of the first opening 341 may be lengths in the first axial (X) direction and in the second axial (Y) direction, may be equal to each other or different from each other, and may be varied depending on the size of the light emitting chip. A lower area of the first opening 341 may be wider than an area of the top surface of the first light emitting chip 100, and may be narrower than the area of the top surface of the first lead frame 125 exposed to the cavity 140.

As shown in FIGS. 6, 8, and 11, a lateral side 344 of the second opening 343 may face lateral sides of the second light emitting chip 101 while surrounding the upper portion of the second light emitting chip 101. A lower end 302 of the second opening 343 may be closer to the lateral side of the second light emitting chip 101 as the lower end 302 may be closer to the second lead frame 135. Lower widths of the second opening 343 may be wider than that of the top surface of the second light emitting chip 101, and may be narrower than the width of the second lead frame 135 exposed onto the cavity 140. The lateral side 344 of the second opening 343 may have a surface inclined or perpendicular to the flat bottom surface of the body 110. The lower width of the second opening 343 may be equal to those of the first opening 341. The lower width of the first opening 341 may be wider than an area of the top surface of the second light emitting chip 101 and may be narrower than an area of the top surface of the second lead frame exposed to the cavity 140. As shown in FIG. 8, the first and second openings 341 and 343 may have upper widths x1 and y1 wider than the lower widths G1 and G2, and light reflection efficiency may be improved due to a difference between the widths.

Referring to FIG. 1 and FIGS. 5 to 7, the separation part 345 may include a first recess 371 to receive a first connection member 171 connected with the first light emitting chip 100, and a second recess 372 to receive a second connection member 172 connected with the second light emitting chip 101. As shown in FIGS. 6 and 8, the length x2 of the separation part 345 in the first axial (X) direction may be greater than a sum of the widths G3 and G4 of the first and second gap parts 116 and 117. Since the separation part 345 covers the upper portion and circumference of the first and second protection chips 102 and 103, light loss may be reduced.

The first recess 371 may receive the third connection member 173 connected with the first protection chip 102, and the second recess 372 may receive the fourth connection member 174 connected with the second protection chip 103. As shown in FIG. 7, a width E1 of the first recess 371, which may be, for example, a width of an entrance in which the first opening 341 is open, may provide a space to allow the first and third connection members 171 and 173 to pass. A width E2 of the second recess 372, which may be, for example, a width of an entrance in which the second opening 343 is open, may provide a space to allow the second and fourth connection members 172 and 174 to pass. The first recess 371 may open from a portion of the lateral side 342 of the first opening 341 to an upper portion of the fourth lead frame 155. The first recess 371 may be an open region lower than the top surface of the separation part 345 and may connect the first opening 341 with the fourth lead frame 155.

The second recess 372 may open from a portion of the lateral side 344 of the second opening 343 to an upper portion of the fifth lead frame 155. The second recess 372 may be an open region lower than the top surface of the separation part 345 and may connect the second opening 343 with the fifth lead frame 155. The first and second recesses 371 and 372 may connect the first and second openings 341 and 343 with the third and fourth lead frames 145 and 155 through regions lower than the top surface of the separation part 345. The first and second recesses 371 and 372 may be connected with each other through the recess region 340 in the separation part 345 as shown in FIG. 7. The recess region 340 may be provided on the first and second gap parts 116 and 117.

As shown in FIG. 1 and FIGS. 5 to 8, the first and second recesses 371 and 372 may have heights that the first and second recesses 371 and 372 may not contact. A height C1 of the recess region 340 provided under the separation part 345 of the reflective frame 310 may be 230 µm or more, for example, in a range of 250 µm to 300 µm from the top surfaces of the third and fourth lead frames 145 and 155. When the height C1 is excessively low, the connection members 171, 172, 173, and 174 provided in the recess region 340 may contact the lead frames. When the height C is excessive high, stiffness of the separation part 345 may be weakened.

The top surface 315 of the reflective frame 310 may be a flat surface, but the embodiment is not limited thereto. Outer surfaces 311, 312, 313, and 314 of the reflective frame 310 may be provided on a same plane as that of the lateral side portions 111, 112, 113, and 114 of the body 110, or provided with a stepped structure with respect to the lateral side portions 111, 112, 113, and 114. The outer surfaces 311, 312, 313, and 314 of the reflective frame 310 may be inclined at a same angle as that of the lateral side portions 111, 112, 113, and 114 of the body 110, or provided perpendicularly to the lateral side portions 111, 112, 113, and 114 of the body 110.

As shown in FIG. 8, the top surface 115 of the body 110 may be provided on a same horizontal plane as that of the top surfaces of the light emitting chips 100 and 101, or may be lower than the top surfaces of the light emitting chips 100 and 101. Alternatively, the top surface 115 of the body 110 may be higher than the top surfaces of the light emitting chips 100 and 101 and may be lower than the highest points of the first and second connection members 171 and 172 of FIG. 3.

As shown in FIGS. 1 to 3, regarding a coupling structure between the body 110 and the reflective frame 310, the body 110 and the reflective frame 310, which have mutually engaged structures, may include a protrusion structure and a groove structure. The body 110 may include a plurality of first coupling parts or couplers 181, 182, and 183 and the reflective frame 310 may include a plurality of second coupling parts or couplers 381, 382, and 383. One of the first coupling parts 181, 182, and 183 and the second coupling parts 381, 382, and 383 may be a protrusion structure, and another may be a groove structure. For the convenience of explanation, the first coupling parts 181, 182, and 183 may be protrusion structures, and the second coupling parts 381, 382, and 383 may be groove structures. At least two or three of the first coupling parts 181, 182, and 183 may be provided in the body 110. The first coupling parts 181, 182, and 183 may be provided at mutually different corner regions of the body 110. The first coupling parts 181, 182, and 183 may not be formed at one of the edge regions. A region in which the first coupling parts 181, 182, and 183 may not be formed may be an electrode identifying region 390 on the reflective frame 310. The electrode identifying region 390 may be provided to identify a polarity of an electrode of the light emitting device 300.

The first coupling parts 181, 182, and 183 may protrude in the direction of the second coupling parts 381, 382, and 383 or the reflective frame 310. The first coupling parts 181, 182, and 183 may have shapes provided at corner regions while extending a predetermined length toward mutually different lateral side portions. For example, the first coupling parts 181, 182, and 183 may have angled shapes or linear shapes provided at the corner regions while extending toward mutually different lateral side portions, but the embodiment is not limited thereto. As shown in FIG. 3, lengths of the first coupling parts 181, 182, and 183 extending toward adjacent two lateral side portions may be equal to each other or different from each other. For example, the extension length in the first axial (X) direction may be longer than the extension length in the second axial (Y) direction.

The second coupling parts 381, 382, and 383 may be formed in grooves corresponding to protrusions of the first coupling parts 181, 182, and 183. As shown in FIG. 7, the second coupling parts 381, 382, and 383 may have groove shapes recessed upward from the bottom surface 316 of the reflective frame 310. The second coupling parts 381, 382, and 383 may be spaced apart from each other. The second coupling parts 381, 382, and 383 may extend in the directions of adjacent two lateral side portions and may have extension lengths F1 and F2 equal to each other or different from each other. For example, the extension length F1 in the first axial (X) direction may be longer than the extension length F2 in the second axial (Y) direction. An interval F3 between two adjacent coupling parts 381 and 383 provided on the second outer surface 313 of the reflective frame 310 may be wider than an interval F4 between two adjacent coupling parts 382 and 383 provided on the fourth outer surface 314.

Each of the second coupling parts 381, 382, and 383 may have outer regions R4 and R5 extending in a stepped structure, with an inclined surface or a curved surface. The outer regions R4 and R5 may have a two-stepped structure, an oblique shape, or a shape having a convex surface. Since the outer regions R4 and R5 of the second coupling parts 381, 382, and 383 face outer regions R2 and R3 of the first coupling parts 181, 182, and 183 of the body 110, a gap with the top surface of the body 110 may be reduced. The outer regions R4 and R5 of the second coupling parts 381, 382, and 383 may make close contact with the outer regions R2 and R3 of the first coupling parts 181, 182, and 183 or may be bonded to the outer regions R2 and R3 of the first coupling parts 181, 182, and 183 by an adhesive layer 250, as shown in FIG. 9. The outer regions R4 and R5 of the second coupling parts 381, 382, and 383 and the outer regions R2 and R3 of the first coupling parts 181, 182, and 183 may make close contact with each other. A gap between the reflective frame 310 and the body 110 may be minimized, thereby preventing the reflective frame 310 from being moved.

Referring to FIGS. 3, 8, and 9, the lateral sides 342 and 344 of the first and second openings 341 and 343 of the reflective frame 310 may be provided around the light emitting chips 100 and 101. The lower end 301 of the first opening 341 may be lower than the top surface of the first light emitting chip 100, for example, at a location of an active layer L1 of the first light emitting chip 100. The lower end 302 of the second opening 343 may be provided lower than the top surface of the second light emitting chip 101, for example, at a location of the active layer of the second light emitting chip 101. The lower ends 301 and 302 of the lateral sides of the first and second openings 341 and 343 may be spaced apart from top surfaces of the first and second lead frames 125 and 135 by a predetermined distance. For example, as shown in FIG. 9, distances between the lower ends 301 and 302 of the lateral sides of the first opening 341 and the first lead frame 125 may be 50 µm or more, for example, in a range of 80 µm to 110 µm. When the lower ends 301 and 302 of the lateral sides of the first and second openings 341 and 343 are located lower than in this range, electrical interference with the first and second lead frames 125 and 135 may occur. When the lower ends 301 and 302 are located higher than in this range, light loss may occur.

The lower ends 301 and 302 of the lateral sides of the first and second openings 341 and 343 may be spaced apart from the first and second light emitting chips by a predetermined distance. For example, as shown in FIG. 9, an interval B2 between the lower ends 301 and 302 of the lateral sides of the first opening 341 and a lateral side of the first light emitting chip 100 may be 80 µm or more, for example, in the range of 90 µm to 120 µm. When an interval B1 between the lower ends 301 and 302 of the lateral sides of the first and second openings 341 and 343 and the first and second light emitting chips 100 and 101 is narrower than in this range, a process error may not be ensured when the light emitting chips 100 and 101 are mounted. When the interval B1 is wider than in this range, sizes of the openings 341 and 343 may increase so that only a slight improvement of the light extraction efficiency may occur.

The recess region 340 in the separation part 345 of the reflective frame 310 may be spaced apart from the top surface of the protrusion 118. Alternatively, a portion of the separation part 345 of the reflective frame 310 may make contact with the protrusion 118 and may support a center of the separation part 345.

A molding member 150 may be provided in the cavity 140. The molding member 150 may include a transmissive material, such as silicon or epoxy, and may be formed as a single layer or a multi-layer. The molding member 150 may be provided in the first and second openings 341 and 343, but the embodiment is not limited thereto. The molding member 150 provided in the first and second openings 341 and 343 may be provided in a recess of the reflective frame 310, but the embodiment is not limited thereto. When the molding member 150 is provided, the molding member 150 may support the reflective frame 310.

The molding member 150 may include a phosphor to convert a wavelength of light emitted from the light emitting chips 100 and 101, and the phosphor may include one selected from among YAG, TAG, silicate, nitride, oxy-nitride based materials. The phosphor may include at least one of a red phosphor, a yellow phosphor, a blue phosphor, and a green phosphor, but the embodiment is not limited thereto. The phosphor may include phosphors provided on the first and second light emitting chips 100 and 101 to emit light having mutually different colors, but the embodiment is not limited thereto.

A surface of the molding member 150 may be provided in at least one of a flat shape, a concave shape, and a convex shape, but the embodiment is not limited thereto. The surface of the molding member 150 may be a light output surface. An optical lens may be provided at an upper portion of the molding member 150. The optical lens may include a convex lens, a concave lens, and a convex lens having a total reflection surface at a center thereof with respect to the light emitting chips 100 and 101, but the embodiment is not limited thereto.

Figure 13:
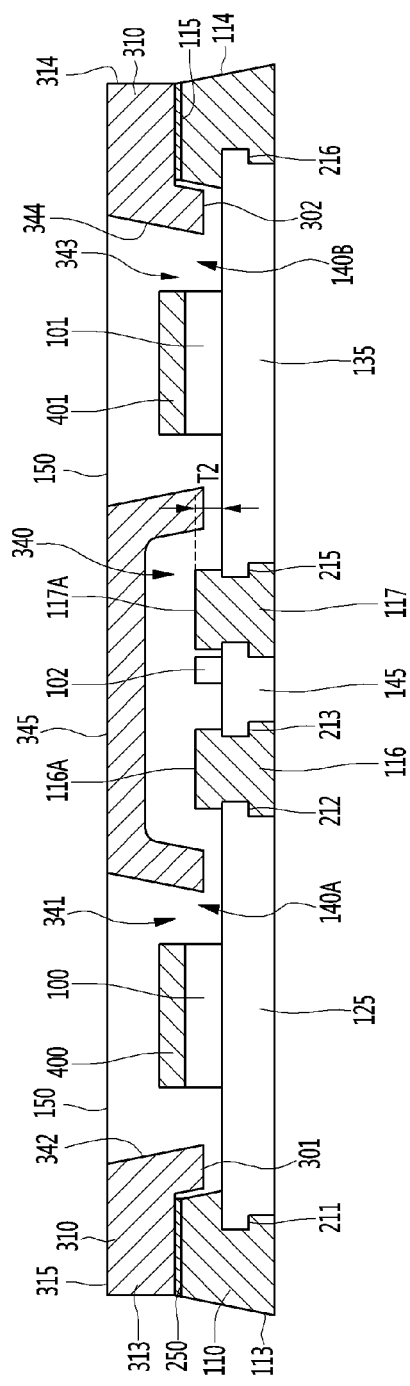
FIG. 13 is a sectional view showing another embodiment of the light emitting device of FIG. 8.

FIG. 13 is a sectional view showing another embodiment of FIG. 8. In the following description with reference to FIG. 13, same or similar portions as those of previously disclosed embodiments may be referred to. Referring to FIGS. 13 and 3, first and second gap parts 116 and 117 of the light emitting device may include first and second reflective parts 116A and 117A protruding higher than the top surfaces of the first and second lead frames 125 and 135. The first reflective part 116A may protrude in a region between the first lead frame 125, and the third and fourth lead frames 145 and 155 to reflect light emitted from the first light emitting chip 100. The second reflective part 117A may protrude in a region between the second lead frame 135 and the third and fourth lead frames 145 and 155 to reflect the light emitted from the second light emitting chip 101.

Thicknesses T2 of the first and second reflective parts 116A and 117b may be equal to or higher than heights of top surfaces of the first and second protection chips 102 and 103, thereby reducing light absorption into the first and second protection chips 102 and 103. In addition, according to the embodiment, a reflective material may be coated on the surfaces of the first and second protection chips 102 and 103 to prevent the light absorption. The reflective material may include a resin material, such as silicon or epoxy, containing a metallic oxide, for example, at least one of $TiO_2$, $SiO_2$, and $Al_2O_3$. The reflective material may prevent light from being absorbed into the first and second protection chips 102 and 103.

The cavity 140 may be provided at a first region 140A of the lower portion thereof with a reflective structure to surround the first light emitting chip 100 and may be provided at a second region 140B with a reflective structure to surround the second light emitting chip 101. The reflective structures may be formed by sidewalls of the cavity 140 and the first and second reflective parts 116A and 117A.

The first light emitting chip 100 may be provided thereon with a first phosphor film 400 and the second light emitting chip 101 may be provided thereon with a second phosphor film 401. The first phosphor film 400 and the second phosphor film 401 may include the same phosphor or mutually different phosphors. For example, when the first and second light emitting chips 100 and 101 emit blue light, the first phosphor film 400 may have a yellow phosphor, and the second phosphor film 401 may have a red phosphor. Alternatively, when the first and second light emitting chips 100 and 101 emit blue light, the first phosphor film 400 may have a green phosphor, and the second phosphor film 401 may have a red phosphor. When the first and second light emitting chips 100 and 101 emit the blue light, the first phosphor film 400 may have yellow and green phosphors, and the second phosphor film 401 may have red and green phosphors. When the first and second light emitting chips 100 and 101 emit ultraviolet light, the first phosphor film 400 may have blue and red phosphors, and the second phosphor film 401 may have a green phosphor. A type of a phosphor contained in the phosphor films 400 and 401 may vary depending on the first and second light emitting chips 100 and 101, and a phosphor may be contained in the molding member 150, but the embodiment is not limited thereto.

The reflective frame 310 may be bonded onto the body 110 by the adhesive layer 250, and the separation part 345 between the first and second openings 341 and 343 may be provided on the first and second gap parts 116 and 117. The recess region 340 in the separation part 345 may be spaced apart from the first and second gap parts 116 and 117.

Figure 14:
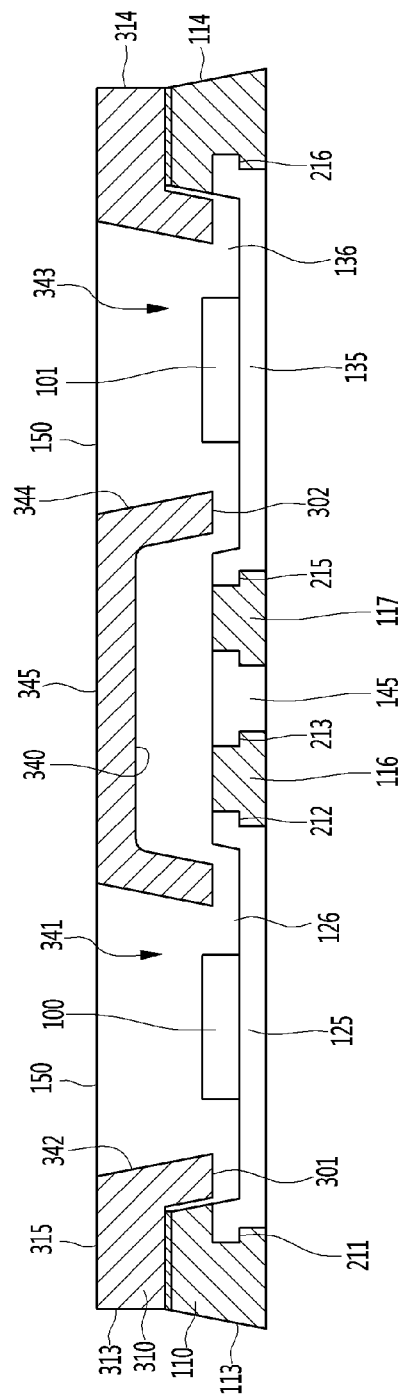
FIG. 14 is a sectional view showing another embodiment of the light emitting device of FIG. 8.

FIG. 14 is a sectional view showing another embodiment of FIG. 8. In the following description with reference to FIG. 14, description of same or similar portions as those of previous disclosed embodiments may be referred to. Referring to FIGS. 3 and 14, in a light emitting device, a first concave part or portion 126 may be provided on a first lead frame 125, and a first light emitting chip 100 may be provided on the first concave part 126. A second concave part or portion 136 may be provided on a second lead frame 135, and the second light emitting chip 101 may be provided on the second concave part 136. A bottom surface of the first concave part 126 may be lower than the top surface of the first lead frame 125, and a bottom surface of the second concave part 136 may be lower than the top surface of the second lead frame 135. The first and second concave parts 126 and 136 may have a cup shape or a stepped shape.

The lower ends 301 of the first opening 341 of the reflective frame 310 may be lower than the top surface of the first light emitting chip 100 and adjacent to the first concave part 126. For example, the lower end 301 of the first opening 341 of the reflective frame 310 may be under the top surface of the first lead frame 125, but the embodiment is not limited thereto. Accordingly, light emitted from the first light emitting chip 100 may be reflected by the lateral side 342 of the first opening 341. The lower end 302 of the second opening 343 of the reflective frame 310 may be lower than the top surface of the second light emitting chip 101 and adjacent to the second concave part 136. For example, the lower end 302 of the second opening 343 of the reflective frame 310 may be lower than the top surface of the second lead frame 135, but the embodiment is not limited thereto. Accordingly, light emitted from the second light emitting chip 101 may be reflected by the lateral side 344 of the second opening 343.

Figure 15:
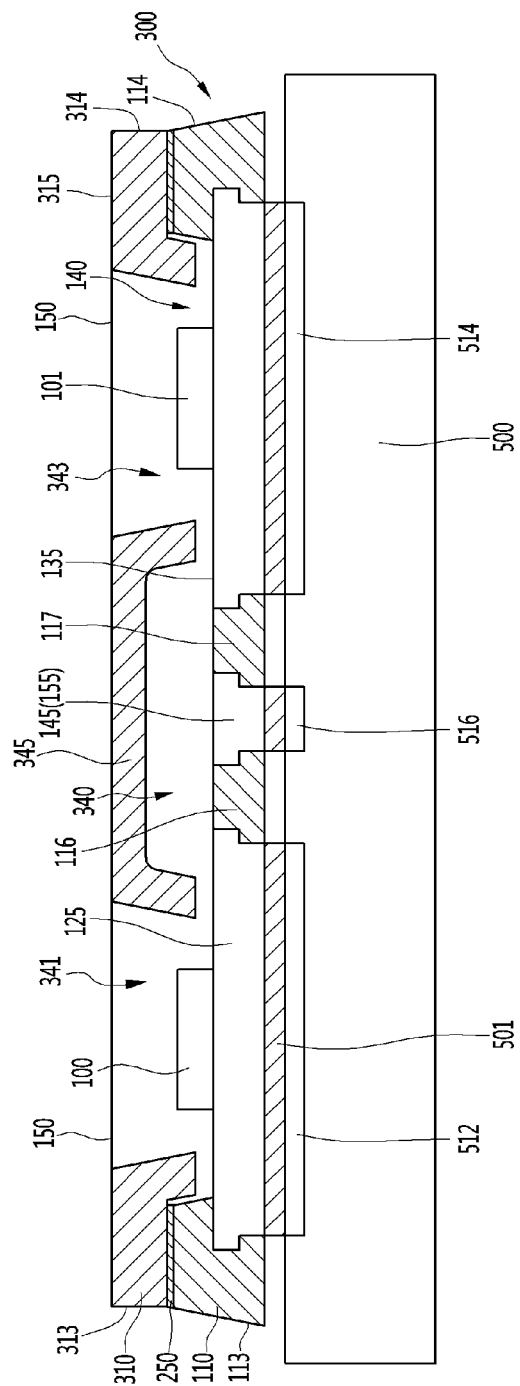
FIG. 15 is a view showing a light unit having a light emitting device of FIG. 8.

FIG. 15 is a sectional view showing a light unit or module having the light emitting device of FIG. 8. In the following description of FIG. 15, description of same or similar portions as those of previous disclosed embodiments may be referred to. Referring to FIGS. 15 and 3, in the light unit, a light emitting device 300 may be provided on a module substrate 500, and at least one light emitting device may be provided on the module substrate 500. The module substrate 400 may be bonded to the first to fourth lead frames 125, 135, 145, and 155 through a bonding member 401. The bonding member 501 may include an adhesive material such as a solder. In the module substrate 400, pads 512, 514, and 516 may be provided at locations corresponding to bottom surfaces of the first to fourth lead frames 125, 135, 145, and 155. The module substrate 500 may be a printed circuit board (PCB). For example, the module substrate 500 may include a PCB including a resin material, a metal core PCB (MCPCB) having a metallic heat radiation layer, and a flexible PCB (FPCB), but the embodiment is not limited thereto.

Figure 16:
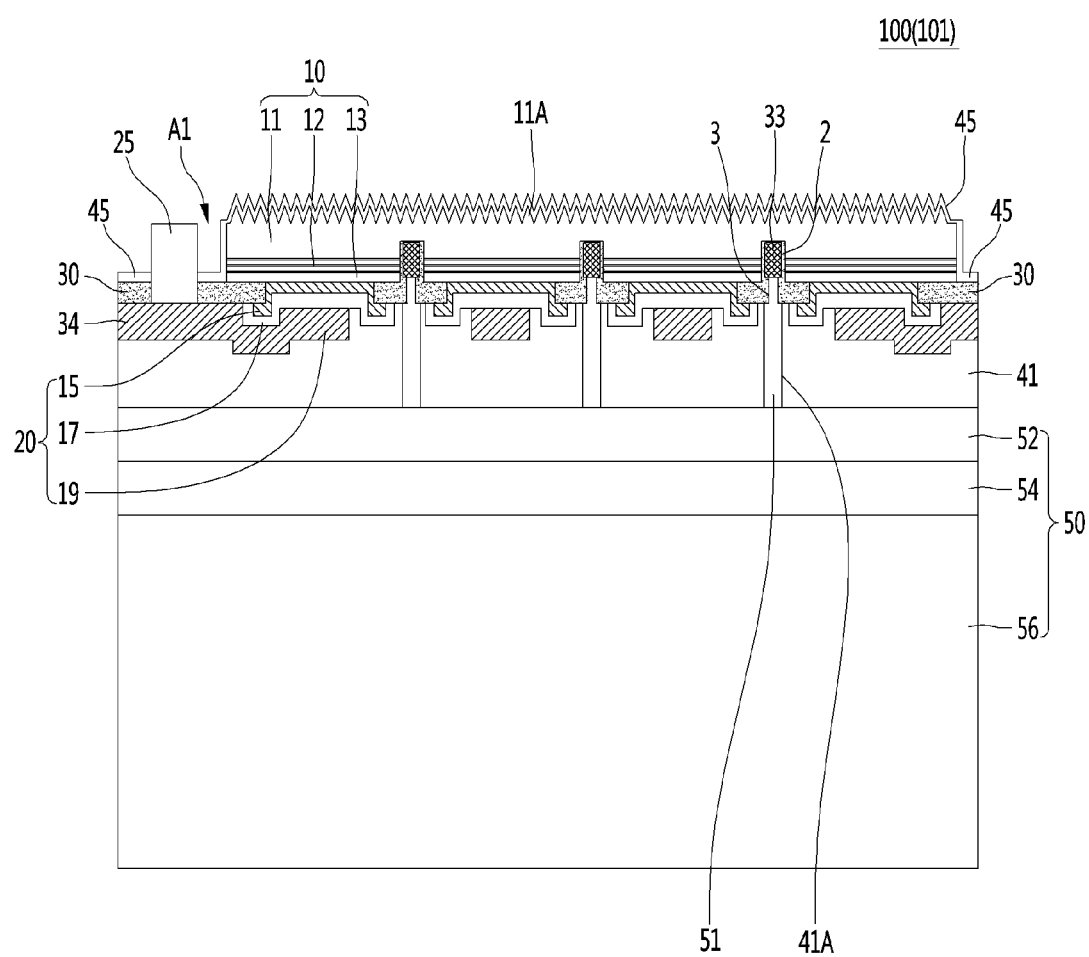
FIG. 16 is a sectional view showing an embodiment of a light emitting chip of the light emitting device according to the embodiment.

FIG. 16 is a sectional view showing a light emitting chip of FIG. 1. Referring to FIG. 16, the light emitting chips 100 and 101 may include a light emitting structure having a plurality of semiconductor layers 11, 12, and 13, a first electrode layer 20 under the light emitting structure 10, a second electrode layer 50 under the first electrode layer 20, an insulating layer 41 between the first and second electrode layers 20 and 50, and a pad 25. The light emitting structure 10 may include a first semiconductor layer 11, an active layer 12, and a second semiconductor layer 13. The active layer 12 may be between the first and second semiconductor layers 11 and 13. The active layer 12 may be under the first semiconductor layer 11, and the second semiconductor layer 13 may be under the active layer 12.

The first semiconductor layer 11 may include an n type semiconductor layer doped with a first conductive dopant, for example, an n type dopant, and the second semiconductor layer 13 may include a p type semiconductor layer doped with a second conductive dopant, for example, a p type dopant. In addition, the first semiconductor layer 11 may include the p type semiconductor, and the second semiconductor layer 13 may include the n type semiconductor layer.

For example, the first semiconductor layer 11 may include the n type semiconductor layer. The first semiconductor layer 11 may be realized with a compound semiconductor. The first semiconductor layer 11 may be realized with at least one of Group II-VI compound semiconductors and Group III-V compound semiconductors. For example, the first semiconductor layer 11 may be realized with a semiconductor material having a composition formula of $In_xAl_yGa_{1-x-y}N$ ($0 \leq x \leq 1$, $0 \leq y \leq 1$, $0 \leq x+y \leq 1$), which may be selected from, for example, GaN, AlN, AlGaN, InGaN, InN, InAlGaN, AlInN, AlGaAs, GaP, GaAs, GaAsP, and AlGaInP, and doped with an n type dopant such as Si, Ge, Sn, Se, and Te.

The active layer 12 may emit light due to a difference in energy band gap between materials constituting the active layer 12 as electrons or holes injected into the active layer 12 through the first semiconductor layer 11 meet holes or electrons injected into the active layer 12 through the second semiconductor layer 13. The active layer 12 may be formed as one of a single well structure, a multi-well structure, a quantum dot structure, and a quantum wire structure, but the embodiment is not limited thereto.

The active layer 12 may be realized with a compound semiconductor. The active layer 12 may be realized with at least one of Group II-VI and III-V compound semiconductors. The active layer 12 may be realized with a semiconductor material having a composition formula of $In_xAl_yGa_{1-x-y}N$ ($0 \leq x \leq 1$, $0 \leq y \leq 1$, $0 \leq x+y \leq 1$). When the active layer 12 is a multi-well structure, the active layer 12 may include a plurality of well layers and a plurality of barrier layers. For example, the active layer 12 may include a cycle of InGaN well/GaN barrier layers, InGaN well/AlGaN barrier layers, InAlGaN well/InAlGaN barrier layers, or GaN well/AlGaN barrier layers.

The second semiconductor layer 13 may be realized with a p type semiconductor layer. The second semiconductor layer 13 may be realized with a compound semiconductor. The second semiconductor layer 13 may be realized with at least one of Group II-V compound semiconductors and Group III-V compound semiconductors. For example, the second semiconductor layer 13 may be realized with a semiconductor material having a composition formula of $In_xAl_yGa_{1-x-y}N$ ($0 \leq x \leq 1$, $0 \leq y \leq 1$, $0 \leq x+y \leq 1$). For example, the second semiconductor layer 13 may include one selected from the group consisting of GaN, AlN, AlGaN, InGaN, InN, InAlGaN, AlInN, AlGaAs, GaP, GaAs, GaAsP, and AlGaInP, and may be doped with a p type dopant such as Mg, Zn, Ca, Sr, and Ba.

The first semiconductor layer 11 may include a p type semiconductor layer, and the second semiconductor layer 13 may include an n type semiconductor layer. A semiconductor layer including an n type semiconductor or a p type semiconductor layer having a conductivity type different from that of the second semiconductor layer 13 may be further formed under the second semiconductor layer 13. Accordingly, the light emitting structure 10 may have at least one of np, pn, npn, and pnp junction structures. The first and second semiconductor layers 11 and 13 may have a uniform doping concentration or an irregular doping concentration. In other words, the light emitting structure 10 may have various structures, but the embodiment is not limited thereto.

An InGaN/GaN superlattice structure or an InGaN/InGaN superlattice structure, in which mutually different semiconductor layers may be alternately provided, may be provided between the first semiconductor layer 11 and the active layer 12 or between the second semiconductor layer 13 and the active layer 12. An AlGaN layer doped with the second conductive dopant may be formed between the second semiconductor layer 13 and the active layer 12. A rough uneven part or portion 11A may be formed on the top surface of the first semiconductor layer 11. The uneven part 11A may improve the light extraction efficiency. A side sectional view of the uneven part 11A may have a polygonal shape, or a semis-spherical shape.

The first electrode layer 20 may be provided between the light emitting structure 10 and the second electrode layer 50, electrically connected with the second semiconductor layer 13 of the light emitting structure 10, and electrically insulated from the second electrode layer 50. The first electrode layer 20 may include a first contact layer 15, a reflective layer 17, and a capping layer 19. The first contact layer 15 may be provided between the reflective layer 17 and the second semiconductor layer 13, and the reflective layer 17 may be provided between the first contact layer 15 and the capping layer 19. The first contact layer 15, the reflective layer 17, and the capping layer 19 may be formed of mutually conductive materials, but the embodiment is not limited thereto.

The first contact layer 15 may make contact with the second semiconductor layer 13, for example, through an ohmic contact with the second semiconductor layer 13. The first contact layer 15 may be formed of, for example, a conductive oxide layer, a conductive nitride, or metal. The first contact layer 15 may include at least one of ITO (Indium Tin Oxide), ITON (ITO Nitride), IZO (Indium Zinc Oxide), IZON (IZO Nitride), AZO (Aluminum Zinc Oxide), AGZO (Aluminum Gallium Zinc Oxide), IZTO (Indium Zinc Tin Oxide), IAZO (Indium Aluminum Zinc Oxide), IGZO (Indium Gallium Zinc Oxide), IGTO (Indium Gallium Tin Oxide), ATO (Antimony Tin Oxide), GZO (Gallium Zinc Oxide), IZON (IZO Nitride), ZnO, IrOx, RuOx, NiO, Pt, Ag, and Ti.

The reflective layer 17 may be electrically connected with the first contact layer 15 and the capping layer 19. The reflective layer 17 may reflect light incident therein from the light emitting structure 10 to increase an amount of light to be extracted out. The reflective layer 17 may be formed of metal having at least 70% of a light reflective index. For example, the reflective layer 17 may be formed of metal including at least one of Ag, Ni, Al, Rh, Pd, Ir, Ru, Mg, Zn, Pt, Cu, Au, and Hf or the alloy thereof. In addition, the reflective layer 17 may be a multi-layer using the metal or the alloy thereof and the transmissive material of ITO (Indium-Tin-Oxide), IZO (Indium-Zinc-Oxide), IZTO (Indium-Zinc-Tin-Oxide), IAZO (Indium-Aluminum-Zinc-Oxide), IGZO (Indium-Gallium-Zinc-Oxide), IGTO (Indium-Gallium-Tin-Oxide), AZO (Aluminum-Zinc-Oxide), or ATO (Antimony-Tin-Oxide). For example, the reflective layer 17 may include at least one of Ag, Al, an Ag—Pd—Cu alloy or an Ag—Cu alloy. For example, the reflective layer 17 may be formed by alternately arranging an Ag layer and a Ni layer, and may include Ni/Ag/Ni, a Ti layer or a Pt layer. The first contact layer 15 may be formed under the reflective layer 17, and at least a portion of the first contact layer 15 may pass through the first reflective layer 17 to make contact with the second semiconductor layer 13. The reflective layer 17 may be provided under the first contact layer 15, and a portion of the reflective layer 17 may make contact with the second semiconductor layer 13 through the first adhesive layer 15.

The light emitting device may include a capping layer 19 provided under the reflective layer 17. The capping layer 19 may make contact with the bottom surface of the reflective layer 17, and the contact part 34 may be coupled to the pad 25 to serve as a wire layer to transfer power supplied from the pad 25. The capping layer 19 may be formed of metal. For example, the capping layer 19 may include at least one of Cu, Ni, Ti, Ti—W, Cr, W, Pt, V, Fe, and Mo. The contact part 34 of the capping layer 19 may be provided at a region that may not vertically overlap the light emitting structure 10, and may perpendicularly overlap the pad 25. The contact part 34 of the capping layer 19 may be provided at a region that may not vertically overlap the first contact layer 15 and the reflective layer 17. The contact part 34 of the capping layer 19 may be provided lower than the light emitting structure 10, and may make direct contact with the pad 25.

The pad 25 may be formed as a single layer or a multi-layer. In the case of the single layer, the pad 25 may include Au. In the case of the multi-layer, the pad 25 may include at least two of Ti, Ag, Cu, and Au. In the multi-layer, the pad 25 may be a stack structure of Ti/Ag/Cu/Au or Ti/Cu/Au. At least one of the reflective layer 17 and the first contact layer 15 may make direct contact with the pad 25, but the embodiment is not limited thereto. The pad 25 may be provided at a region A1 between an outer sidewall of the first electrode layer 20 and the light emitting structure 10. The protective layer 30 and the transmissive layer 45 may make contact with a peripheral portion of the pad 25.

The protective layer 30 may be provided on the bottom surface of the light emitting structure 10, may make contact with the bottom surface of the second semiconductor layer 13 and the first contact layer 15, and may make contact with the reflective layer 17. An inner portion of the protective layer 30 vertically overlapped with the light emitting structure 10 may vertically overlap the region for the protrusion 16. An outer portion of the protective layer 30 may extend onto the contact part 34 of the capping layer 19, and may vertically overlap the contact part 34. The outer portion of the protective layer 30 may make contact with the pad 25, for example, may be provided at surrounding surfaces of the pad 25.

The inner portion of the protective layer 30 may be provided between the light emitting structure 10 and the first electrode layer 20, and an outer portion of the protective layer 30 may be provided between the transmissive layer 45 and the capping layer 19. The outer portion of the protective layer 30 may extend to an outer region A1 from the sidewall of the light emitting structure 10 to prevent moisture from infiltrating into the light emitting device. The protective layer 30 may be defined as a channel layer, a low-reflective-index material, or an isolation layer. The protective layer 30 may be realized with an insulating material, for example, an oxide or a nitride. For example, the protective layer 30 may include at least one selected from the group consisting of $SiO_2$, $Si_xO_y$, $Si_3N_4$, $Si_xN_y$, $SiO_xN_y$, $Al_2O_3$, $TiO_2$, and AlN. The protective layer may be formed of a transparent material.

The light emitting device may include an insulating layer 41 to electrically insulate the first electrode layer 20 from the second electrode layer 50. The insulating layer 41 may be provided between the first electrode layer 20 and the second electrode layer 50. The protective layer 30 may make contact with an upper portion of the insulating layer 41. The insulating layer 41 may be realized with, for example, an oxide or a nitride. For example, the insulating layer 41 may be formed of at least one selected from the group consisting of $SiO_2$, $Si_xO_y$, $Si_3N_4$, $Si_xN_y$, $SiO_xN_y$, $Al_2O_3$, $TiO_2$, and AlN.

The insulating layer 41 may have a thickness in a range of 100 nm to 200 nm. If the insulating layer 41 is formed with the thickness of less than 100 nm, a problem may occur with its insulating property. If the insulating layer 41 is formed with the thickness exceeding 2000 nm, the insulating layer 41 may be broken in a subsequent process. The insulating layer 41 may make contact with a top surface of the first electrode layer 20 and a top surface of the second electrode layer 50, and may be formed with a thickness thicker than that of each of the protective layer 30, the capping layer 19, the contact layer 15, and the reflective layer 17.

The second electrode layer 50 may include an anti-spread layer 52 provided under the insulating layer 41, a bonding layer 54 provided under the anti-spread layer 52, and a conductive support member or support 56 provided under the bonding layer 54, and may be electrically connected with the first semiconductor layer 11. In addition, the second electrode layer 50 may include one or two selected from among the anti-spread layer 52, the bonding layer 54, and the conductive support member 56, and at least one of the anti-spreading layer 52 and the bonding layer 54 may not be formed.

The anti-spreading layer 52 may include at least one of Cu, Ni, Ti, Ti—W, Cr, W, Pt, V, Fe, and Mo. The anti-spreading layer 52 may function as a diffusion barrier layer between the insulating layer 41 and the bonding layer 54. The anti-spread layer 52 may be electrically connected with the bonding layer 54 and the conductive support member 56, and electrically connected with the first semiconductor layer 11. The anti-spreading layer 52 may prevent a material container in the bonding layer 54 from being spread toward the reflective layer 17 in the process of providing the bonding layer 54. The anti-spreading layer 52 may prevent tin (Sn) contained in the bonding layer 54 from affecting the reflecting layer 17. The bonding layer 54 may include barrier metal or bonding metal. For example, the bonding layer 54 may include at least one of Ti, Au, Sn, Ni, Cr, Ga, In, Bi, Cu, Ag, Nb, Pd and Ta. The conductive support member 56 may support the light emitting structure 10 according to the embodiment to serve as a heat radiation function. The bonding layer 54 may include a seed layer.

The conductive support member 56 may be formed of at least one of a metallic substrate, or a carrier substrate. The conductive support member 56 may include at least one of semiconductor substrates doped with Ti, Cr, Ni, Al, Pt, Au, W, Cu, Mo, Cu—W and impurities (Si, Ge, GaN, GaAs, ZnO, SiC, or SiGe). The conductive support member 56 may be a layer to support the light emitting device 100 and may have a thickness corresponding to 80% of a thickness of the second electrode layer 50, that is, thickness of at least 30 μm.

The second contact layer 33 may be provided in the first semiconductor layer 11 and may make contact with the first semiconductor layer 11. A top surface of the second contact layer 33 may be provided above a bottom surface of the first semiconductor layer 11, electrically connected with the first semiconductor layer 11, and insulated from the active layer 12 and the second semiconductor layer 13. The second contact layer 33 may be electrically connected with the second electrode layer 50. The second contact layer 33 may be provided through the first electrode layer 20, the active layer 12, and the second semiconductor layer 13. The second contact layer 33 may be provided in a recess 2 in the light emitting structure 10, and insulated from the active layer 12 and the second semiconductor layer 13 through the protective layer 30. A plurality of second contact layers 33 may be spaced apart from each other.

The second contact layer 33 may be connected with the protrusion 51 of the second electrode layer 50, and the protrusion 51 may protrude from the anti-spreading layer 52. The protrusion 51 may pass through region 41A formed in the protective layer 30 and the insulating layer 41, and may be insulated from the first electrode layer 20. The second contact layer 33 may include at least one of, for example, Cr, V, W, Ti, Zn, Ni, Cu, Al, Au, and Mo. The protrusion 51 may include at least one material constituting the anti-spreading layer 52 and the bonding layer 54, but the embodiment is not limited thereto. For example, the protrusion 51 may include at least one of Ti, Au, Sn, Ni, Cr, Ga, In, Bi, Cu, Ag, Nb, Pd, and Ta.

The pad 25 may be electrically connected with the first electrode layer 20, and exposed to a region A1 outside the sidewall of the light emitting structure 10. One or a plurality of pads 25 may be provided. The pad 25 may include at least one of Cu, Ni, Ti, Ti—W, Cr, W, Pt, V, Fe, and Mo. The transmissive layer 45 may protect the surface of the light emitting structure 10 and insulate the pad 25 from the light emitting structure 10. The transmissive layer 45 may make contact with a peripheral portion of the protective layer 30. The transmissive layer 45 may have a refractive index lower than that of a semiconductor layer material constituting the light emitting structure 10 to improve light extraction efficiency. The transmissive layer 45 may be realized with an oxide or a nitride. For example, the transmissive layer 45 may be formed of at least one selected from the group consisting of $SiO_2$, $Si_xO_y$, $Si_3N_4$, $Si_xN_y$, $SiO_xN_y$, $Al_2O_3$, $TiO_2$, and AlN. Meanwhile, the transmissive layer 45 may be omitted depending on designs. According to the embodiment, the light emitting structure 10 may be driven by the first electrode layer 20 and the second electrode layer 50.

The light emitting device may include a plurality of light emitting structures which may be individually driven in one device. Although the embodiment has been described as two light emitting structures provided in one light emitting device, at least three or four light emitting structures may be provided in one light emitting device, and may be individually driven. The light emitting device having such a structure may be usefully applied to a vehicle light device, for example, a headlamp or a tail light. In addition, a phosphor film may be provided on the light emitting structure 10.

According to embodiments disclosed herein, a metallic reflective frame may be provided around a plurality of light emitting chips on a body to improve reflection efficiency. Accordingly, stiffness at a center of a light emitting device having a longer length may be enhanced. Reliability may be improved in a structure of the light emitting device, and heat radiation efficiency of the light emitting device may be improved. Reliability of the light emitting device and a light unit or module having the light emitting device may be improved.

Embodiments disclosed herein provide a light emitting device having a reflective frame coupled to a body and having an opening corresponding to each of a plurality of light emitting chips. Embodiments disclosed herein provide a light emitting device having a metallic reflective frame provided on a body and a plurality of lead frames surrounding each of a plurality of light emitting chips. Embodiments disclosed herein provide a light emitting device including a body having a length of a first axial direction longer than a length of a second axial direction, and a plurality of lead frames coupled to an inside of the body in the second axial direction of the body.

According to embodiments disclosed herein, a light emitting device may include a body, first and second lead frames coupled to the body, a first light emitting chip provided on the first lead frame, a second light emitting chip provided on the second lead frame, and a reflective frame provided on the body, the first lead frame, and the second lead frame. The reflective frame may include a plurality of openings spaced apart from each other, and the openings may include a first opening provided therein with the first light emitting chip and a second opening provided therein with the second light emitting chip.

According to embodiments disclosed herein, a light emitting device may include a body having a cavity, first and second lead frames coupled to the body and provided at different regions in the cavity, third and fourth lead frames coupled to the body and provided between the first and second lead frames, a first light emitting chip provided on the first lead frame, a second light emitting chip provided on the second lead frame, and a reflective frame provided on the body, including a first opening to open an upper portion of the first light emitting chip, a second opening to open an upper portion of the second light emitting chip, and a separation part between the first and second openings. The body may include first and second lateral side portions opposite to each other and third and fourth lateral side portions opposite to each other. Lengths of the first and second lateral side portions may be longer than those of the third and fourth lateral side portions, and the first lead frame may include a first lead part protruding from the first lateral side portion of the body and a second lead part protruding from the second lateral portion of the body. The second lead frame may include a third lead part protruding from the first lateral side portion of the body and a fourth lead part protruding from the second lateral side portion of the body. The third lead frame may include a fifth lead part protruding from the first lateral side portion of the body and the fourth lead frame may include a sixth lead part protruding from the second lateral side portion of the body.

When a substrate, a frame, a sheet, a layer, or a pattern is referred to as being "on" or "under" another substrate, another frame, another sheet, or another pattern, it can be "directly" or "indirectly" on the other substrate, the other frame, the other sheet, the other layer, or the other pattern, or one or more intervening layers may also be present. Such a position of the layer has been described with reference to the drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body;
first and second lead frames coupled to the body;
a first light emitting chip on the first lead frame;
a second light emitting chip on the second lead frame; and
a reflective frame over the body and the first and second lead frames,
wherein the reflective frame includes a plurality of openings spaced apart from each other, the plurality of openings having a first opening provided therein with the first light emitting chip and a second opening provided therein with the second light emitting chip.

2. The light emitting device of claim 1, wherein the reflective frame is formed of a metallic material.

3. The light emitting device of claim 1, wherein the reflective frame is spaced apart from the first and second lead frames and electrically insulated from the first and second lead frames.

4. The light emitting device of claim 1, wherein the first and second openings include sides that are inclined with respect to a bottom surface of the body.

5. The light emitting device of claim 4, wherein lower ends of lateral sides of the first and second openings are lower than a top surface of the light emitting chip.

6. The light emitting device of claim 3, further comprising a first connector connected with the first light emitting chip and a second connector connected with the second light emitting chip, wherein the reflective frame includes a separation part between the first and second openings, the separation part having a first recess connected with the first opening, a portion of the first connector provided in the first recess; and a second recess connected with the second opening, a portion of the second connector provided in the second recess.

7. The light emitting device of claim 6, wherein the first and second recesses are provided under a top surface of the separation part.

8. The light emitting device of claim 6, wherein the separation part includes a recess region provided at a lower portion thereof to connect the first and second recesses with each other.

9. The light emitting device of claim 6, further comprising a third lead frame provided between the first and second lead frames, connected with the first light emitting chip, and provided under the separation part of the reflective frame.

10. The light emitting device of claim 9, further comprising a fourth lead frame provided between the first and second lead frames, connected with the second light emitting chip, provided under the separation part of the reflective frame, and spaced apart from the third lead frame.

11. The light emitting device of claim 10, wherein the body includes first and second lateral side portions opposite to each other, and third and fourth lateral side portions opposite to each other,
the first and second lateral side portions having lengths longer than lengths of the third and fourth lateral side portions,
the first lead frame having a first lead part that protrudes from the first lateral side portion of the body and a second lead part that protrudes from the second lateral side portion of the body, and
the second lead frame having a third lead part that protrudes from the first lateral side portion of the body and a fourth lead part that protrudes from the second lateral side portion of the body.

12. The light emitting device of claim 11, wherein the third lead frame includes a fifth lead part that protrudes from the first lateral side portion of the body,
the fourth lead frame includes a sixth lead part that protrudes from the second lateral side of the body,
the fifth lead part is provided between the first and third lead parts,
the sixth lead part is provided between the second and fourth lead parts,
the fifth lead part has a width wider than a bottom width of the third lead frame, and
the sixth lead part has a width wider than a bottom width of the fourth lead frame.

13. A light emitting device comprising:
a body having a cavity therein;
first and second lead frames coupled to the body and provided in different regions of the cavity;
third and fourth lead frames coupled to the body and provided between the first and second lead frames;
a first light emitting chip on the first lead frame;
a second light emitting chip on the second lead frame; and
a reflective frame provided on the body and having a first opening that opens to an upper portion of the first light emitting chip, a second opening that opens to an upper portion of the second light emitting chip, and a separation part between the first and second openings,
wherein the body includes first and second lateral side portions opposite to each other and third and fourth lateral side portions opposite to each other, the first and second lateral side portions have lengths longer than lengths of the third and fourth lateral side portions,
the first lead frame includes a first lead part protruding from the first lateral side portion of the body and a second lead part protruding from the second lateral side portion of the body,
the second lead frame includes a third lead part protruding from the first lateral side portion of the body and a fourth lead part protruding from the second lateral side portion of the body,
the third lead frame includes a fifth lead part coupled to the first light emitting chip and protruding from the first lateral side portion of the body, and
the fourth lead frame includes a sixth lead part coupled to the second light emitting chip and protruding from the second lateral side of the body.

14. The light emitting device of claim 13, further comprising:
a first connector connected with the first light emitting chip and the third lead frame;
a second connector connected with the second light emitting chip and the fourth lead frame;
a first protection chip on the third lead frame; and
a third connector connected with the first protection chip and the first lead frame, wherein portions of the first to third connectors are provided under the separation part.

15. The light emitting device of claim 14, further comprising a second protection chip on the fourth lead frame; and a fourth connector connected with the second protection chip and the second lead frame.

16. The light emitting device of claim 13, further comprising a plurality of first couplers provided outside the body; and a plurality of second couplers provided outside the reflective frame and coupled to the first couplers, wherein one of the first and second couplers has a protrusion structure, and a remaining one of the first and second couplers has a groove structure.

17. The light emitting device of claim 13, further comprising an adhesive layer to bond a top surface of the body to the reflective frame.

18. The light emitting device of claim 13, further comprising a protrusion provided between the third and fourth lead frames and protruding from the top surface of the body, wherein the protrusion includes a material constituting the body and extends upward from top surfaces of the third and fourth lead frames.

19. The light emitting device of claim 13, wherein the separation part of the reflective frame is spaced apart from the protrusion.

20. The light emitting device of claim 13, further comprising a first phosphor film on the first light emitting chip; and a second phosphor film provided on the second light emitting chip.

* * * * *